(12) United States Patent
Zhang

(10) Patent No.: US 6,801,037 B1
(45) Date of Patent: Oct. 5, 2004

(54) DYNAMIC REAL-TIME MAGNETIC RESONANCE IMAGING SEQUENCE DESIGNER

(75) Inventor: Guoping Zhang, Forest Hill, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/325,742

(22) Filed: Dec. 23, 2002

Related U.S. Application Data

(62) Division of application No. 09/852,033, filed on May 10, 2001.
(60) Provisional application No. 60/203,326, filed on May 11, 2000.

(51) Int. Cl.$^7$ ................................................ G01V 3/00
(52) U.S. Cl. ........................ 324/309; 324/318; 600/416
(58) Field of Search ................................ 324/309, 318, 324/312, 322, 300, 307; 600/411, 523, 416; 395/700; 382/128, 131; 345/419

(56) References Cited

U.S. PATENT DOCUMENTS

| | | | | |
|---|---|---|---|---|
| 4,191,919 A | * | 3/1980 | Haney et al. | ................ 324/312 |
| 5,041,789 A | * | 8/1991 | Keller et al. | ................ 324/318 |
| 5,317,260 A | * | 5/1994 | Kasten et al. | ................ 324/309 |
| 5,349,294 A | * | 9/1994 | Kasuboski | ................ 324/309 |
| 5,465,361 A | * | 11/1995 | Hoenninger, III | ........... 395/700 |
| 6,014,581 A | * | 1/2000 | Whayne et al. | ............. 600/523 |
| 6,128,522 A | * | 10/2000 | Acker et al. | ................ 600/411 |
| 6,484,048 B1 | * | 11/2002 | Hoshino et al. | ............ 600/410 |
| 2002/0060566 A1 | * | 5/2002 | Debbins et al. | ............. 324/307 |
| 2003/0002631 A1 | * | 1/2003 | Gaddipati et al. | .......... 378/210 |

* cited by examiner

Primary Examiner—Diego Gutierrez
Assistant Examiner—Tiffany A. Fetzner
(74) Attorney, Agent, or Firm—Raymond Van Dyke Nixon Peabody LLP

(57) ABSTRACT

A system and method for facilitating RF pulse sequence generation and modification and for real-time sequence input modification for use in conjunction with magnetic resonance imaging equipment. A graphical user interface is provided through a display coupled to a digital computer operating as the primary control system for a magnetic resonance imaging scanner and associated hardware. Through the graphical user interface, an operator may choose or design sequences of radiofrequency pulses, gradient waveforms and other input parameters for the magnetic resonance imaging apparatus. Real-time information is also communicated to the operator through the graphical user interface allowing for real-time manipulation of the magnetic resonance imaging inputs and for displaying the magnetic resonance response thereto.

44 Claims, 30 Drawing Sheets

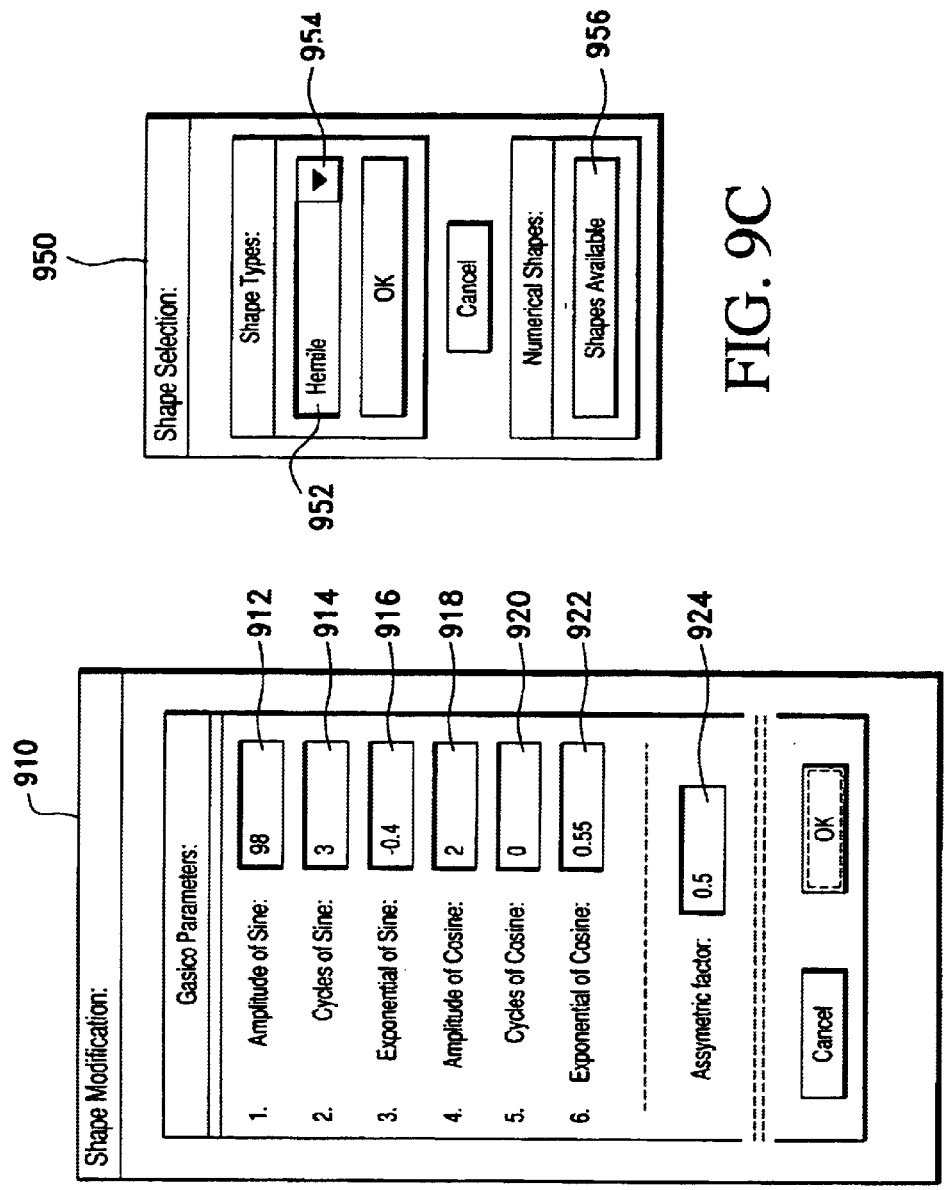

DYNAMIC REAL-TIME MAGNETIC RESONANCE IMAGING SEQUENCE DESIGNER

CROSS REFERENCE TO RELATED APPLICATIONS

This Application for Patent claims the benefit of priority from, and hereby incorporates by reference the entire disclosure of U.S. Provisional Application for Patent No. 60/203,326, filed May 11, 2000, and that of U.S. patent application Ser. No. 09/852,033, filed May 10, 2001, of which the present Application is a divisional.

BACKGROUND OF THE INVENTION

1. Technical Field of the Invention

The present invention relates to the field of magnetic resonance imaging (MRI) and, in particular, to a system and method for aiding the efficient design of pulse sequences.

2. Description of Related Art

Until the development of MRI and Nuclear Magnetic Resonance (NMR) technology by Dr. Raymond V. Damadian in the 1970's, diagnostic imaging of internal physiology was limited to techniques which provide limited soft tissue contrast. For example, as is well understood in the imaging art, computed tomography (CT) techniques depend on tissue density, e.g., soft tissue compared to bone, and usage of contrast media, e.g., barium, both affecting x-ray attenuation and detection. Although CT, at present, reveals better bone detail, MRI is far superior for most other soft tissues, illuminating the internal networks and pathways to physicians without the known deleterious effects of x-rays.

Although a full description of how MRI works is not necessary to the understanding of the subject matter of the present invention, a brief illustration of the physical principles involved is set forth below. In short, MRI is a diagnostic method for providing detailed specimen images through manipulation of atomic nuclei, specifically hydrogen, within a specimen tissue. A fundamental property of individual nuclear particles is that individual particles spin or rotate about their own respective axes. As is understood in physics, a spinning charged particle produces a magnetic moment directed along that particle's axis of rotation. These spinning nuclei and their resulting moments are randomly oriented in the absence of any external magnetic fields. However, by applying a magnetic field, the rotating nuclei essentially align their axes either in parallel or in opposition to the magnetic field. Those nuclei aligned in opposition to the magnetic field have a higher energy than those nuclei that are aligned in parallel with the field. A small majority of nuclei will be aligned in the lower energy state, i.e., in parallel, than opposed to the same field, usually only measuring in parts per million for the excess. By the addition of energy, e.g., by application of radio frequency (RF) energy, to these lower energy state excess nuclei, these nuclei can be transitioned to align themselves antiparallel or in opposition to the magnetic field. As is understood in the art, it is these few realigned nuclei that ultimately provide the information used to generate an MRI image.

While the respective nuclei are generally aligned with the applied magnetic field, it should be understood that this alignment is not precisely with a plane parallel to the axis of the magnetic field. Instead, the nuclear moments align at a slight angle from the axis of the magnetic field and precess about this axis. This frequency of precession, along with the magnetic moment caused by the alignment of the nuclei, comprise the phenomenon on which imaging by magnetic resonance is based.

The frequency of this atomic or nucleic precession, also referred to as the Larmor frequency, is a function of the specific nucleus and the strength of the external magnetic field. The nuclei will absorb energy and induce a signal in adjacent RF receptor coils only at the particle's Larmor frequency—an event referred to as "resonance.", In other words, by applying energy to the specimen at the Larmor frequency, the net magnetic moment of the excess nuclei may be reversed, or deflected, to the opposite or antiparallel direction by causing these parallel state particles to elevate to the higher energy state. The radiofrequency energy pulses applied are referred to as "excitation pulses." The duration of the RF pulse specifies the duration of the nuclear moment deflection. When the excitation pulse is removed, the nuclei will then begin to lose energy, causing the net magnetic moment to return to its original, lower energy state orientation, and the energies emitted during this transmission are used to create the image of the specimen.

Present day MRI devices generally scan only hydrogen atoms. The hydrogen atom is most attractive for scanning since it comprises the largest atomic percentage within the human body and provides the largest magnetic resonance (MR) signal respective to other elements present in human organs. As described hereinabove, every nuclear particle spins about its axis and the individual properties of the spin are defined by the specific nuclear particle in question, e.g., hydrogen, creating a magnetic moment with a defined magnitude and direction. The Magnetic Resonance (MR) signal itself is a complex function dependent upon the concentration of the deflected hydrogen atoms, spin-lattice relaxation time (T1), spin-spin relaxation time (T2), motion within the sample and other factors as is understood in the art.

Another component of the MR signal is, of course, the particular series of RF and magnetic field gradient pulses employed in the form of pulse sequences. Varying the pulse sequences can produce considerable image differences, such as T1 emphasis (T1-weighted), T2 emphasis (T2-weighted), proton density emphasis or combinations thereof. Common sequences include. Gradient Echo (GE), Spin Echo (SE), Inversion Recovery (IR), Double Spin Echo, 3-dimensional Gradient Echo (3DGE), 3-dimensional Spin Echo (3DSE), Fast Spin Echo (FSE), Partial Saturation (PS) and others. It is understood that these sequences are illustrative only and the present invention is in no way limited to application of only these specific sequences. Since one sequence image type may not optimally illustrate an area of consideration, multiple images using varying sequences of pulses may be required to fully analyze the area, as is understood in the art.

At present, conventional MRI systems offer fairly primitive interfaces for the design of the aforementioned pulse sequences. In particular, present MRI systems are ill-suited for sequence designers who must input and modify customized pulse sequences. Furthermore, this input is generally made by coding the sequence in a programming language, e.g., C, and is further complicated in that the coded sequence format must be tailored for each individual machine, thus necessitating that the sequence designer must be skilled in the programming arts along with the MRI technologies or alternatively requiring an MRI sequence designer to work in coordination with a programmer. Consequently, conventional systems generally lack real-time communications with the MRI scanner since each sequence must first be coded and compiled prior to being loaded on the system.

Accordingly, a first object of the present invention is to provide an improved MRI apparatus for more efficient creation and development of MRI pulse sequences.

It is a second object of the present invention to provide a graphical user-interface for performing the mathematical calculations related to MRI pulse sequence design, thereby providing an automatic graphical response of the interface to user manipulation, facilitating interaction between the user and the interface.

It is a third object of the present invention to provide a graphical user-interface for intermediating between the sequence designer and the MRI hardware such that the designer can directly view the details of the entire pulse sequence but can also access and modify the sequences directly through a mouse or keyboard.

It is a fourth object of the present invention to provide a real-time interface, or front-end, between the graphical user-interface and the MRI system hardware that enables real-time communication and interaction between the sequence creator and the MRI system hardware.

It is a fifth object of the present invention to provide real-time communication and interaction between the sequence creator and the MRI system hardware, enabling data acquisition and graphical display of the RF shapes, gradient waveforms and MRI signals received inside the magnetic field and providing analysis of this information in real-time.

It is a sixth object of the present invention to provide a real-time communication and interaction between the sequence creator and the MRI system hardware, thereby enabling dynamic manipulation of the details of a MRI pulse sequence accessed through the graphical user-interface.

It is a seventh object of the present invention to provide a real-time communication and interaction between the sequence creator and the MRI system hardware that enables detection of dynamic deficiencies of the MRI system through feedback information and possible compensation for the deficiencies through sequence manipulation.

It is an eighth object of the present invention to provide a foundation for development of automated calibration of imaging sequences of an MRI system.

SUMMARY OF THE INVENTION

The present invention is directed to a system, apparatus and method for facilitating magnetic resonance imaging (MRI) pulse sequence generation and modification and for real-time sequence input modification for use in conjunction with magnetic resonance imaging equipment A graphical user interface is provided through a display coupled to a digital computer operating as the primary control system for a magnetic resonance imaging scanner and associated hardware. Through the graphical user interface, an operator, either at the site of the MRI unit or at a remote location, may choose or design sequences of radiofrequency pulses, gradient waveforms and other input parameters for the magnetic resonance imaging apparatus. Real-time information is also communicated to the operator through the graphical user interface allowing for real-time manipulation of the magnetic resonance imaging inputs and for displaying the magnetic resonance response thereto.

BRIEF DESCRIPTION OF THE DRAWINGS

A more complete understanding of the system, method and apparatus of the present invention may be obtained by reference to the following Detailed Description when taken in conjunction with the accompanying Drawings wherein:

FIGS. 9A through 9C illustrate various control dialog boxes available through invocation of a shape editor command;

DETAILED DESCRIPTION OF PRESENTLY PREFERRED EXEMPLARY EMBODIMENTS

The numerous innovative teachings of the present application will be described with particular reference to the presently preferred exemplary embodiments. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

As discussed hereinabove, current magnetic resonance (MR) imaging apparatuses may utilize a number of different pulse sequences. More particularly, MR images are obtained by using an appropriate sequence of specific RF pulses, signal (echo)-gathering times (TE) and sequence repetition times (TR). For example, dependent on the desired image emphasis, e.g., T1, T2, or proton density, specific sequence types can produce dramatically different imaging results. As discussed, examples of common pulse sequences include Gradient Echo (GE), Spin Echo (SE), and Inversion Recovery (IR), as well as Double Spin Echo (DSE), 3-D Gradient Echo (3DGE), 3-D Spin Echo (3DSE), and Fast Spin Echo (FSE). Again, it is understood that the present invention is not limited by the sequences listed above. The present invention greatly simplifies the manipulation of MR imaging parameters by allowing for more efficient sequence design and parameter tailoring via a digital computer, as discussed in more detail hereinbelow. The present invention allows a designer to generate and modify a variety of sequences quickly and efficiently through a graphical user interface coupled to a digital computer, where the digital computer is itself may be coupled to the magnetic resonance imaging equipment. Additionally, the system of the present invention allows for real-time communication with the MR scanner providing real-time viewing of MRI signals, gradient waveforms and RF (pulse) shapes. Furthermore, sequences can be calibrated automatically and dynamically in response to parameter input from the designer.

Figure 1:
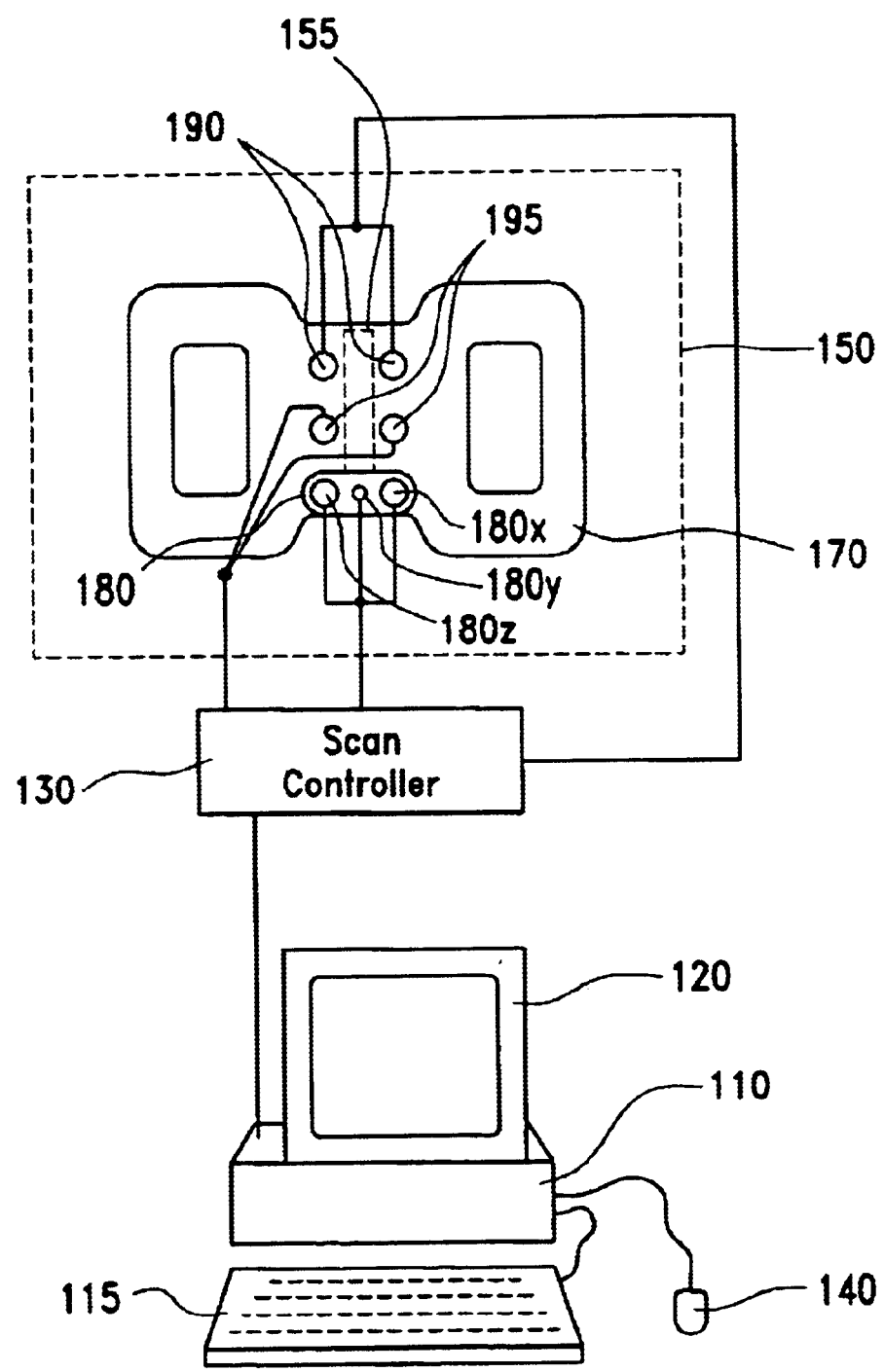
FIG. 1 is a simplified diagram of a magnetic resonance (MRI) imaging system upon which the principles of the present invention are performed.

The present invention may be more readily understood with reference to FIG. 1 in which an exemplary magnetic resonance imaging (MRI) unit 150 as implemented in a preferred embodiment of the present invention is generally depicted. A specimen aperture 155 is centrally located within the bulk of the MRI unit 150 scanning apparatus. Surrounding the specimen aperture 155 are gradient coils 180, transmitter coils 190 and receiver coils 195. The gradient coils 180 provide the gradient waveform for facilitating selective excitation, echo formation and localization, among other purposes, as is understood in the art. Generally, the gradient coils are responsible for generating the gradient field in corresponding axes in mutually orthogonal directions, e.g., designated according to the Cartesian x, y and z coordinates, and thus are driven independent from one another. The transmitter coil 190 is responsible for delivering the RF pulses into the aperture 155 at the Larmor frequency for providing excitation of the protons in the specimen, e.g., a human body. The receiver coil 195 is responsible for acquiring the signal generated from the excited protons during the proton relaxation period, as is understood. Driving these coils and interfacing the MRI unit 150 with a computer 110 is a scan controller 130. The scan controller 130 is the hardware that provides the real-time data delivery to and from the various equipment, e.g., digital to analog converters, as described more fully hereinbelow with reference to FIG. 2. An iron yoke 170 completes the circuit by coupling the poles of the magnetic material of the plates. It is understood that permanent magnets, as well as superconducting magnets, may be suitably interchanged for the resistive electromagnet.

Magnetic material provides a primary static, i.e., uniform and constant with respect to time, magnetic field for surrounding the specimen to be imaged. Gradient fields corresponding to the Cartesian coordinates are used for coding position information with respect to the MRI echoes. Therefore, three separate gradient coils 180 are required, each coil being independently driven. A digital computer 110 equipped with standard input devices, e.g., a keyboard 115, a mouse or pointer device 140, and output devices, e.g., a display 120, facilitate the sequence designer's interaction with the scan controller 130 and thus the overall MRI unit 150. An MRI pulse sequence containing all the information, e.g., three gradient waveforms, RF pulse shape definitions, signal acquisition timing data, etc., for generating an MRI signal, i.e. an echo, can be designed, modified or stored within computer 110 for application to the system according to the present invention.

Figure 2:
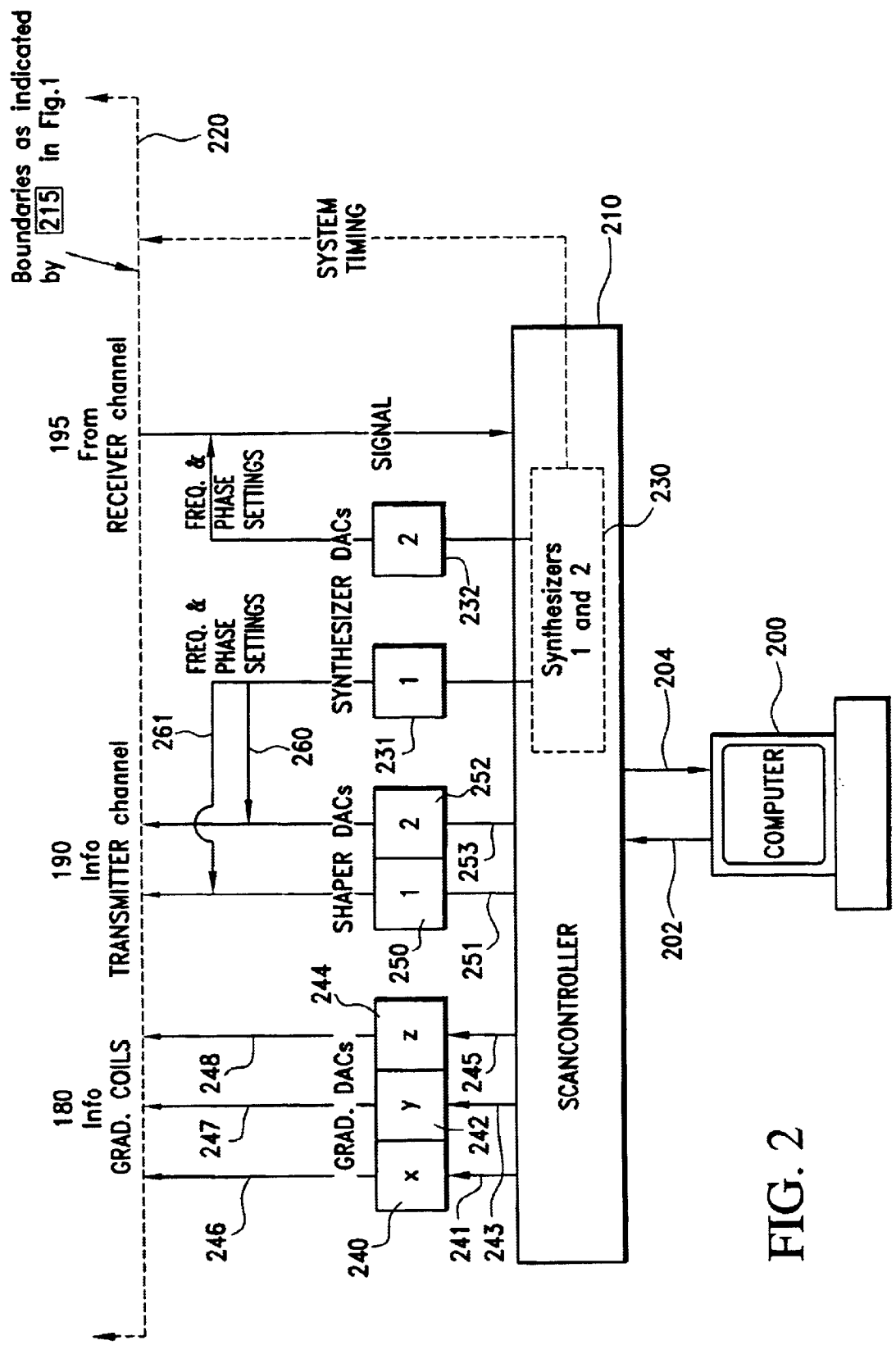
FIG. 2 illustrates an exemplary MRI scan controller interfacing the control system with the MRI hardware on which the present invention can be applied.

With reference now to FIG. 2, a more detailed illustration of the scan controller 130 interfacing between computer 110 and MRI unit 150 is illustrated. Scan controller 130 is in communication with computer 110 over data links 202 and 204 for respectively sending and receiving digital data thereover, although a single bi-directional data link could be substituted therefore. Timing of all interactions, including frequency and phase settings for the respective transmitter 190 and receiver coil 195, with MRI unit 150 is coordinated by synthesizers 230 integrated within scan controller 130. In a preferred embodiment, synthesizers 230 include two synthesizers which interface with two synthesizer DACs 231 and 232. The scan controller 130 interfaces with three gradient DACs 240, 242 and 244, each providing a gradient field in mutually orthogonal planes, as well as two RF shaper DACs 250 and 252. To control and operate an advanced MRI unit as in the preferred embodiment, at least seven DACs are needed to transfer digital input between the scan controller 130 and the MRI unit 150. However, the preferred embodiment is capable of numerous modifications and rearrangements which would require more or less than seven DACs. Gradient DACs 240, 242 and 244 are supplied with digital gradient information describing the x, y and z gradient fields over respective gradient DAC input lines 241, 243 and 245, as defined by the MRI pulse sequence received by scan controller 130 from computer 110. Gradient DACs 240, 242 and 244 then convert the digital gradient data to corresponding analog gradients which are transmitted to respective gradient coils 180 over gradient DAC output lines 246, 247 and 248. Thus, gradient DAC 240 is responsible for driving one gradient coil, e.g., gradient coil 180 X of the set of gradient coils 180. Likewise, each of gradient DACs 242 and 244 are responsible for driving a corresponding one of the remaining gradient coils 180, e.g., respective gradient coils 180 Y and 180 Z.

RF shaper DACs 250 and 252 are responsible for converting the RF shape data, received over output lines 251 and 253, from the digital domain as defined in the MRI pulse sequence received by the scan controller 130 from computer 110, and modulating the representative RF shapes accordingly. The RF shapes are received and modulated by transmitter coil 190, generally at the Larmor frequency, to the subject specimen being analyzed in aperture 155. The frequency and phase of these modulations are controlled by synthesizers 230 over control lines 260 and 261. The echo resulting from the applied gradient waveforms and RF pulses is acquired by the receiver coil 195 during the relaxation periods and accordingly transmitted to the scan controller 130. Proper acquisition of the echo is facilitated by frequency and phase settings applied to the receiver channel by synthesizers 230. These frequency and phase settings are supplied to the scan controller by the MRI pulse sequence data received from computer 110. Thus, the MRI pulse sequence provided by computer 110, under command of an operator thereof, directs the operations for echo generation and acquisition.

Digital computer 110 includes a processor, e.g., a microprocessor from the family of Pentium™ processors manufactured by the Intel™ corporation for directing and performing operations and receiving and executing input from a user, e.g., from the keyboard 115 or pointer device 140. Digital computer 110 also contains a bank of random access memory (RAM) for storing and executing commands therefrom, and a long-term storage media, e.g., magnetic disk, for storing executable instructions that are retrievable and loadable into RAM. In a preferred embodiment, digital computer 110 has a Microsoft Windows™ operating system for coordinating and executing instructions and programs, coordinating communications to peripheral hardware, scheduling tasks and allocating hardware. The present invention preferably includes a Windows executable program stored in long-term storage media and executable from RAM, although other platforms are not precluded.

Figure 3:
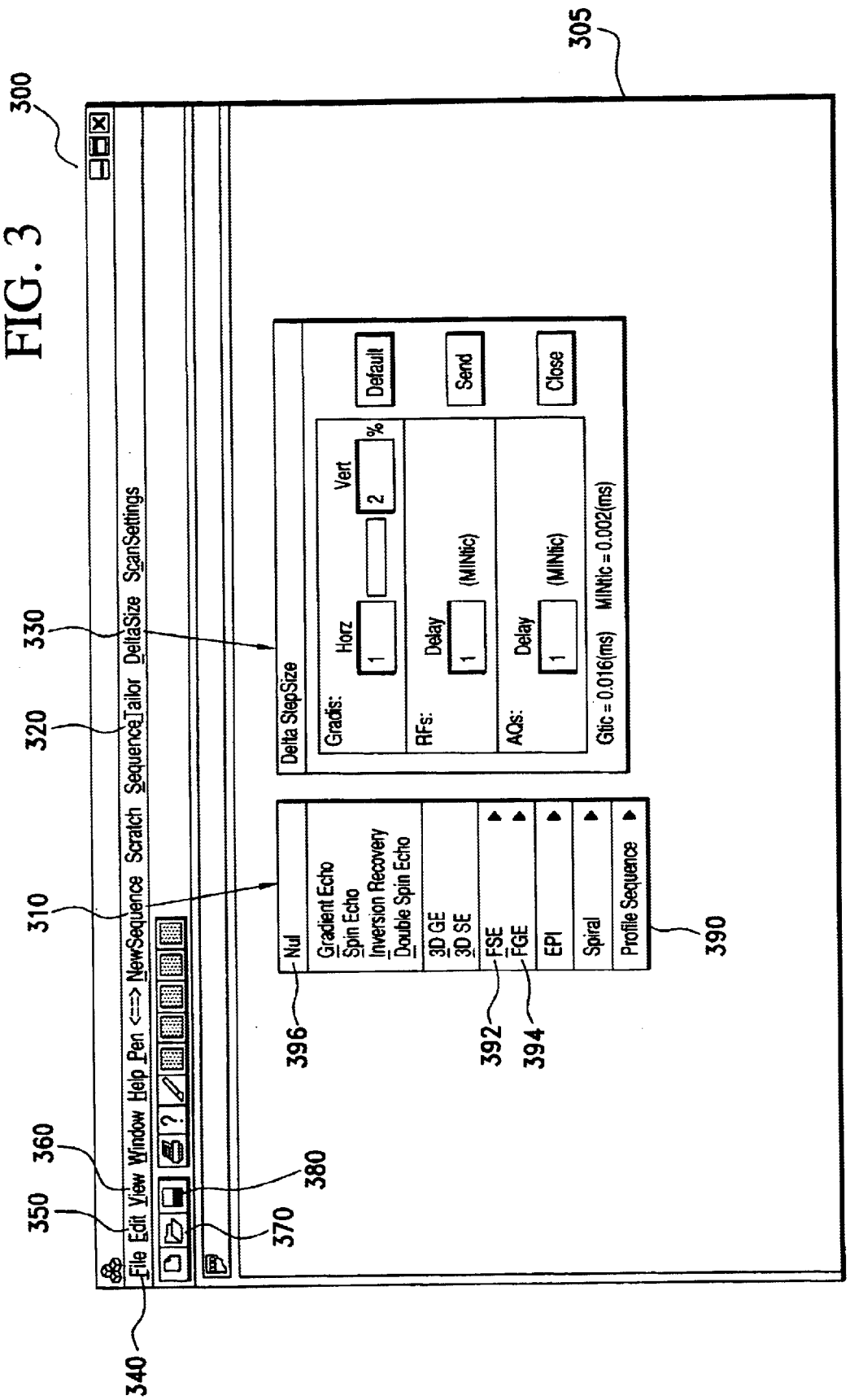
FIG. 3 illustrates an exemplary graphical user interface from which a user can initiate a sequence design according to a preferred embodiment of the present invention.

The present invention allows for efficient creation and customization of generic pulse sequences through a primary design interface 300, i.e., a graphical user interface presented in the form of a window 305, presented on display 120 and generally depicted in FIG. 3. The design interface consists of a number of user selectable menu editor items, e.g., New Sequence 310, Sequence Tailor 320, and Delta Size 330, as well as the common Windows™ menu editor items, e.g., File 340, Edit 350 and View 360, all contained within the mainframe window 305. Various toolbar editor items, e.g., Open File 370 and Save 380, may be located below the menu editor items. Selection of a given menu choice initiates generation of a drop-down box, e.g., drop-down box 390 resulting from user selection of the new sequence menu editor item 310. Each of the menu editor items will generally have a drop-down box associated therewith, each of which generally provide the user with additional selections associated with the selected menu item. A specific dialog box may be activated by selection of a drop-down box item. For example, a Nul Sequence drop-down box item 396, when selected, activates a specific dialog box (not shown) that allows the user to create a sequence from scratch. A Fast Spin Echo (FSE) drop-down box item 392 when selected. activates a dialog box that allows the user to edit a Fast Spin Echo sequence: likewise a Fast Gradient Echo (FGE) drop down box item 394, when selected, activates a dialog box that allows the user to edit a Fast Gradient Echo sequence. The user has unrestricted freedom to build a sequence from existing types, while providing the advantages of copy, modification, and other functions provided by the user interface.

Figure 4:
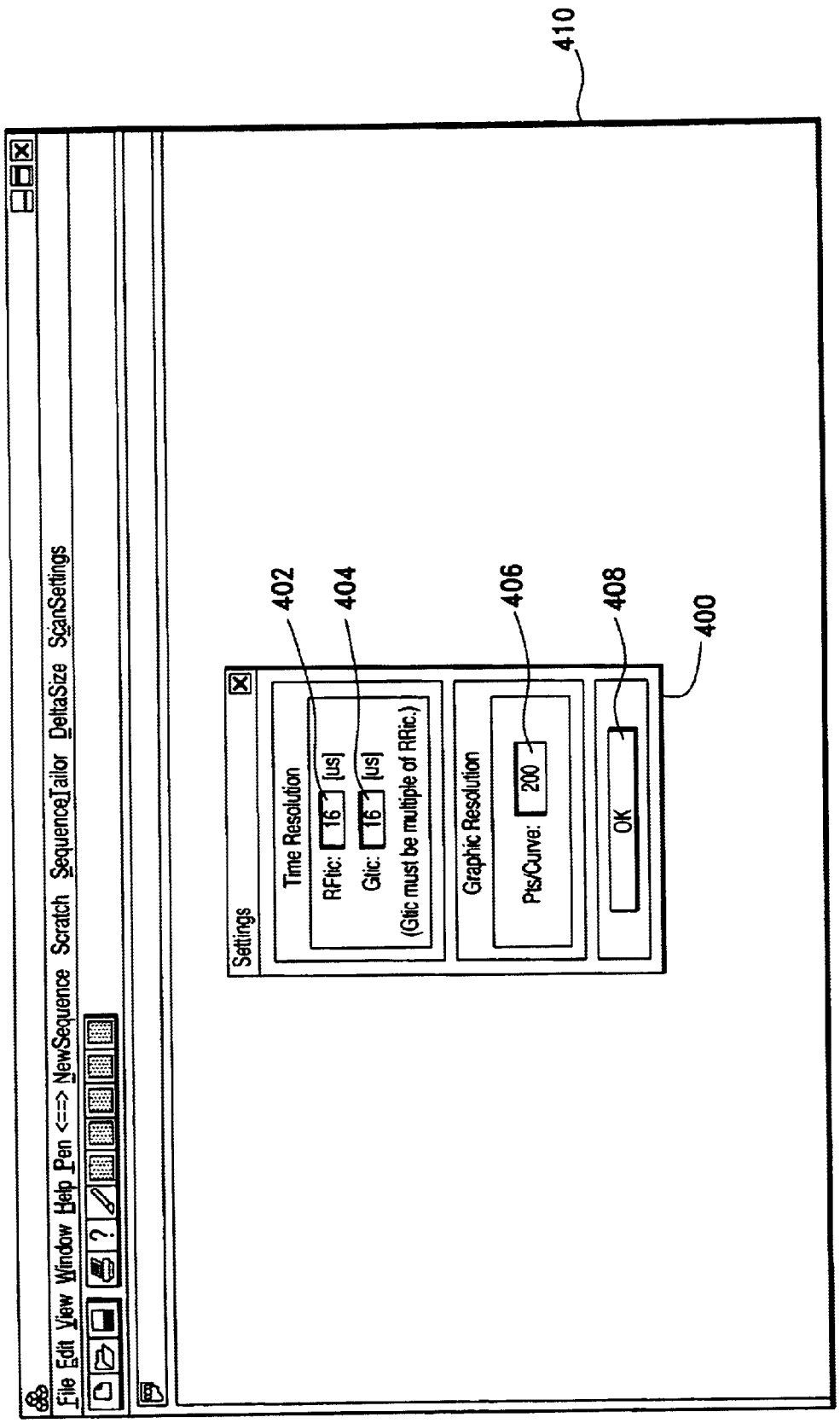
FIG. 4 illustrates an exemplary settings dialog box for accepting user defined resolution parameters.

In FIG. 4 is illustrated an exemplary Settings dialog box 400 displayed within the mainframe window 410 for accepting resolution data for a new sequence. Settings dialog box 400 preferably is activated by selection of any option within drop-down menu 390. The Setting dialog box 400 preferably includes an RF resolution box 402, a gradient resolution box 404, and a graphic resolution box 406. A user may enter a desired numerical value, as depicted in this illustrative example, or accept the system defaults, e.g., 4 and 16 microseconds for the respective RF and gradient settings. The graphic resolution box 406 allows the user to have an option between speed and clarity of the graphic drawing. The user may choose the default graphic resolution, or may opt to enter a higher or lower resolution. When entering a higher resolution, screen repainting requires more time than the default resolution. The lack of speed becomes an issue when performing a sequence with long train echoes, such as FSE and EPI with 127 or 256 echoes. The displayed settings are accepted by selecting the OK button 408.

Figure 5:
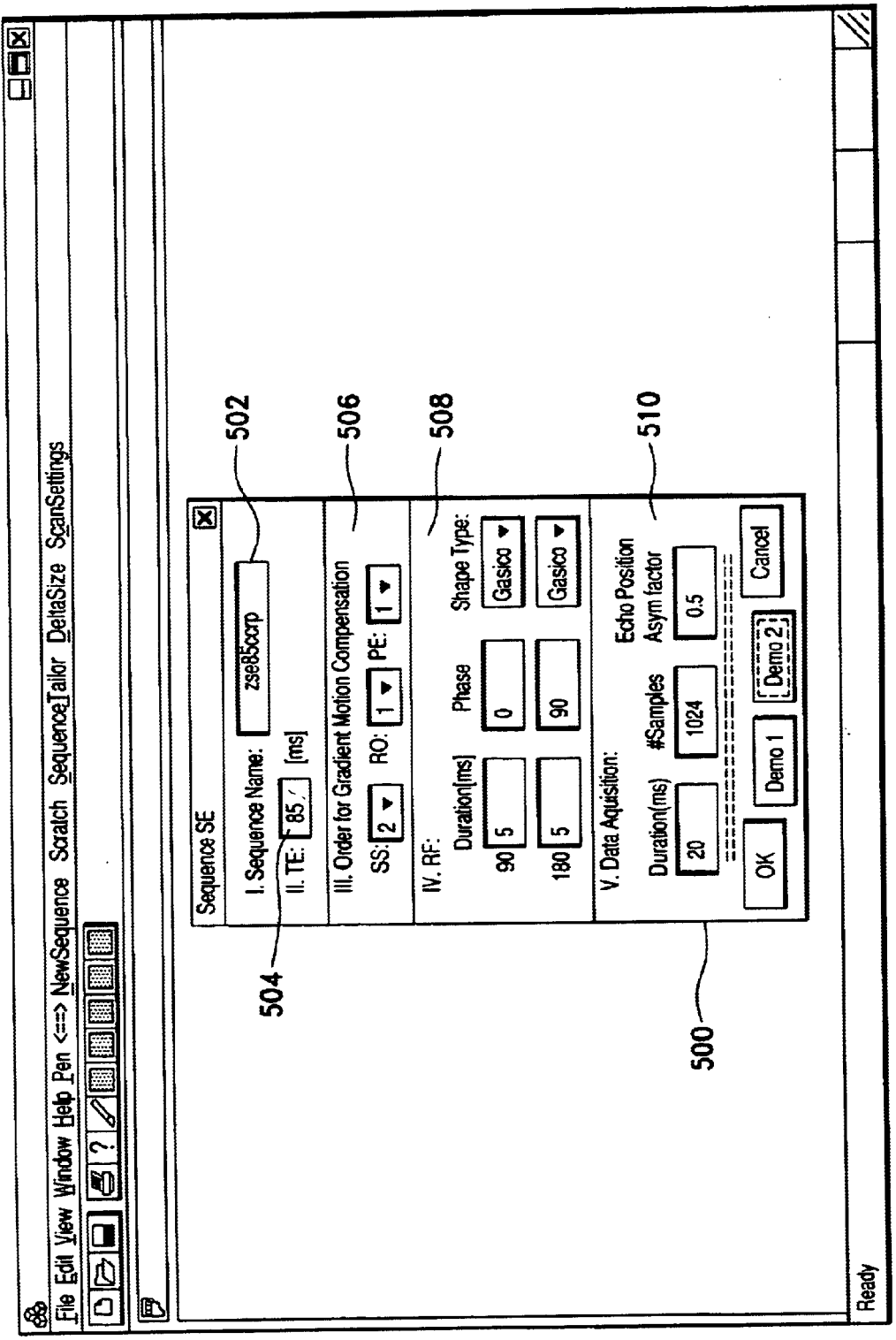
FIG. 5 illustrates an exemplary sequence-type dialog box for allowing a user to define various parameters associated with a given type of pulse sequence.

A sequence parameters dialog box 500, as illustrated in FIG. 5, is displayed in the event that the resolution settings are accepted in the previously displayed Setting dialog box 400. The sequence parameters dialog box 500 displays various user definable attributes or parameters associated with a selected generic pulse sequence. As illustrated in FIG. 5, the sequence parameters dialog box 500 preferably includes default values, such as a sequence name box 502 and a TE field box 504 indicating 85 ms, which are prestored with the associated generic waveform characteristics within computer 110. A number of attribute fields are also included in the sequence parameters dialog box 500, a group of gradient motion compensation field values 506, various RF pulse characteristics field values 508, and data acquisition field values 510. A user designing a sequence can, of course, accept the default values by selecting the confirmation command, e.g., clicking on an OK button. Doing so results in a logical association of the depicted parameters with respect to the selected generic pulse sequence. The user also has the option of canceling the sequence design by selecting a cancel button. Advantageously, the user also has the option to manually modify the displayed sequence or acquisition parameters by manually entering a desired value in any one of the sequence parameter boxes.

Figure 6:
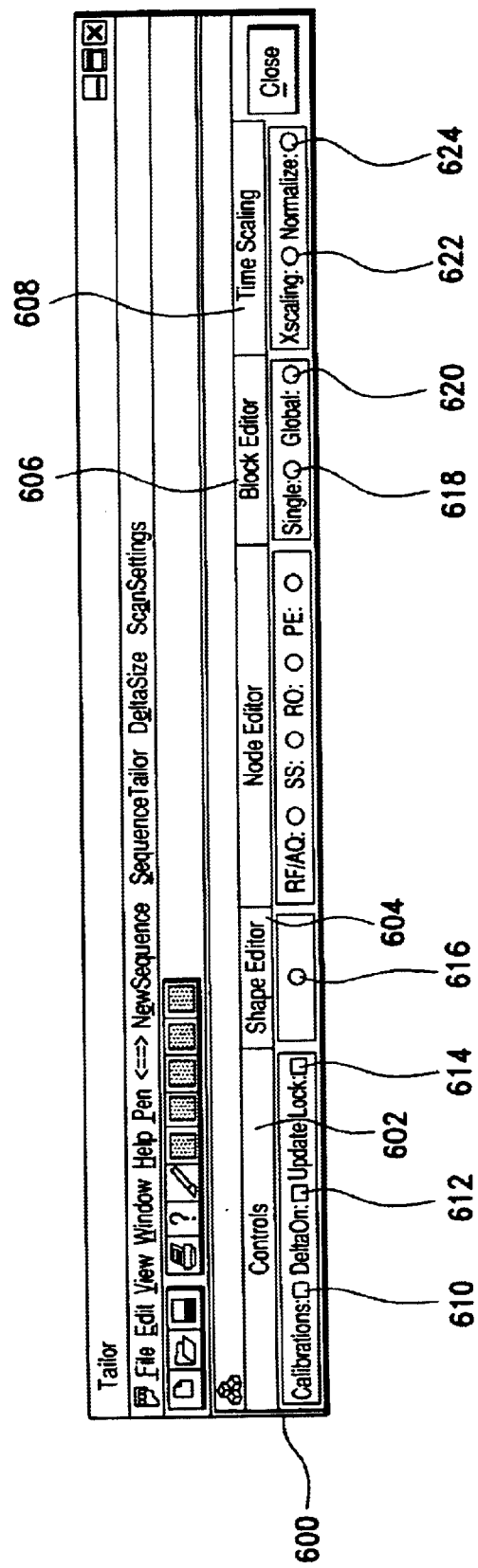
FIG. 6 illustrates an exemplary sequence-tailor dialog box providing various controls for user selection.

FIG. 6 illustrates a sequence tailor dialog box 600 that is preferably displayed after acceptance of the sequence parameters from sequence parameters dialog box 500.

The sequence tailor dialog box 600 comprises four main control features in which the user may interact: controls section 602, shape editor 604, block editor 606, and time scaling 608. Each of these sections have at least one object through which the user may supply input. These objects may include the calibration check box 610, delta on check box 612, the update lock checkbox 614, and the shape editor radio button 616, or any other graphical object useful for obtaining user input.

Figure 7:
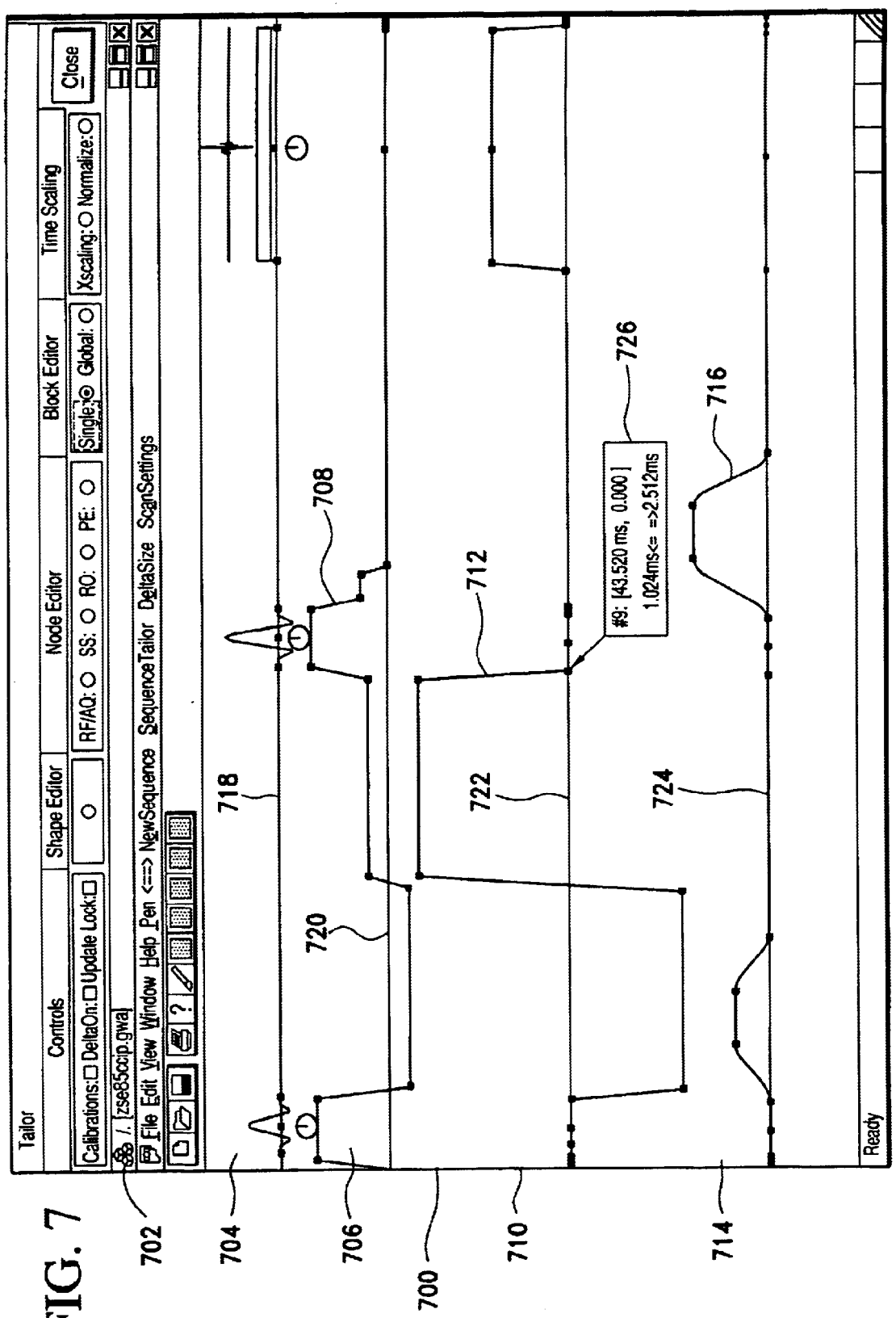
FIG. 7 illustrates an exemplary sequence display for displaying various sequence plots to the user and allowing user interaction therewith.

The various controls activated through the sequence tailor dialog box 600 are preferably available for user interaction therewith during which the current sequence design is displayed to the user according to an exemplary sequence display 700 as illustrated in FIG. 7. The sequence displayed corresponds to a sequence selection made as described hereinabove. The sequence name as entered in the sequence name field 502, is provided on the sequence display 700 title bar 702. The graphical display of a sequence within the sequence display 700 is preferably divided into four general sections. The topmost section of sequence display 700 provides a graphical display of the RF characteristics of the sequence as currently designed and is designated as the RF display 704.

A second portion 706 of the sequence display 700 of FIG. 7, displays a slice select (SS) gradient graph 708, representing the gradient used for a particular slice selective excitation. For example, if an axial (transverse) specimen image is desired, the slice select gradient 708 would be termed "Gz", meaning that the external field is aligned with the z-axis. It is understood that slice select gradient may be taken on any of the Cartesian axes, such as Gx or Gy, depending on the desired slice orientation.

The third portion, RO section 710, of the sequence display 700 of FIG. 7 represents the dephasing or signal acquisition (RO) graph 712. The RO section 710 essentially provides signal location information for a given echo and is typically calculated by a fast Fourier transform algorithm. Final image generation may be performed locally by the digital computer 110 or may be offloaded to high speed numerically intensive systems.

The lowermost portion 714 of the sequence display depicts the phase encoding (PE) graph 716.

Four horizontal lines 718, 720, 722, and 724 respectively indicate the zero-amplitude of the respective RF section 704, SS section 706, RO section 710, and PE section 714. The time coordinate commonly shared among each of the plots is represented according to standard convention along the horizontal and originating from the leftmost side of the sequence display 700. Preferably, the four sections of the sequence display 700 are automatically scaled according to calculated maximum and minimum amplitudes of the waveforms displayed therein. These calculations are performed upon confirmation of the original setting by selection of the OK button in settings dialog box 400. The conventions preferably defining these scaling calculations are:

RF 704—a maximum positive amplitude of a RF shape is of 100 scaling units;

SS 706—the gradient plateau corresponding to the slice selective RF pulse is of 100 scaling units;

RO 710—the gradient plateau corresponding to the data acquisition window is of 100 scaling units; and PE 714—the absolute maximum amplitude among all the PE plateaus, which are stepped during the scan, is of 100 scaling units.

Detailed information regarding a particular point of a given plot may be obtained through user interaction with the user interface 305 preferably through directions of the mouse 140. An exemplary tool tip box 726 is displayed when the mouse pointer is positioned over a given point, or node of a displayed plot. As illustrated, the tool tip box 726 provides detailed numerical data representative of the subject node. The exemplary tool tip box 726 indicates that the selected node is the tenth node (starting from node zero) along the RO gradient and represents a timing of 43.52 milliseconds along the plot. Furthermore, the RO amplitude is also provided (0.000) as well as the respective time differences between the previous node (1.024 ms) and the next node (2.512 ms) of the associated plot. Data related to the other plots can be obtained by simply directing the mouse pointer to a displayed node on any of the displayed plots.

As previously mentioned with respect to FIG. 6, sequence tailor dialog box 600 is provided with various controls such as Block Editor Single 618 and Global 620 radio buttons and time scaling Xscaling 622 and Normalize 624 radio buttons, and preferably is displayed concurrently with user interface 305.

Figure 8A:
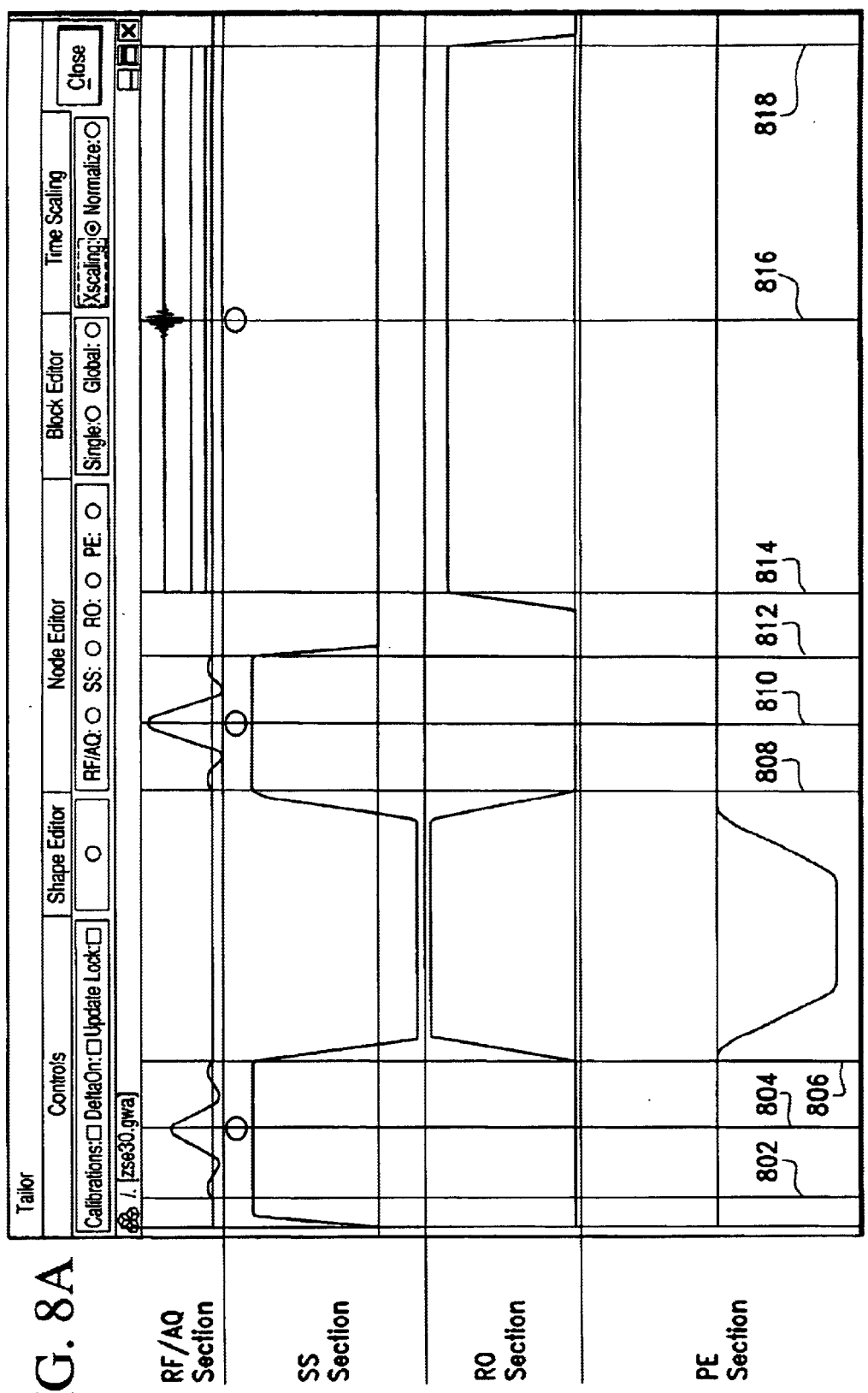
FIGS. 8A through 8C provide additional illustration of an exemplary sequence display having additional control elements invoked for assisting a user in timing analysis of the various plots.
Figure 8B:
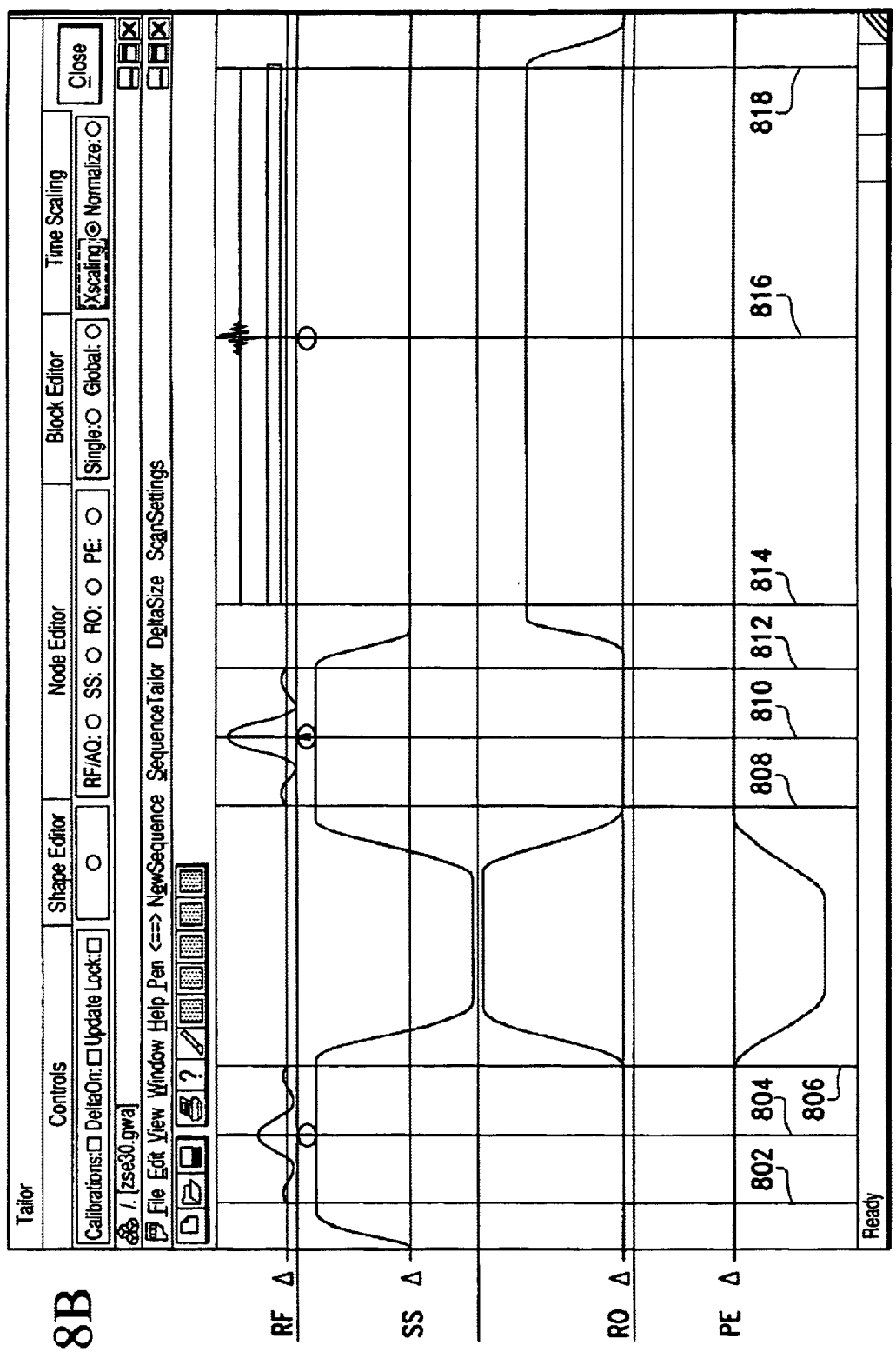
Figure 8C:
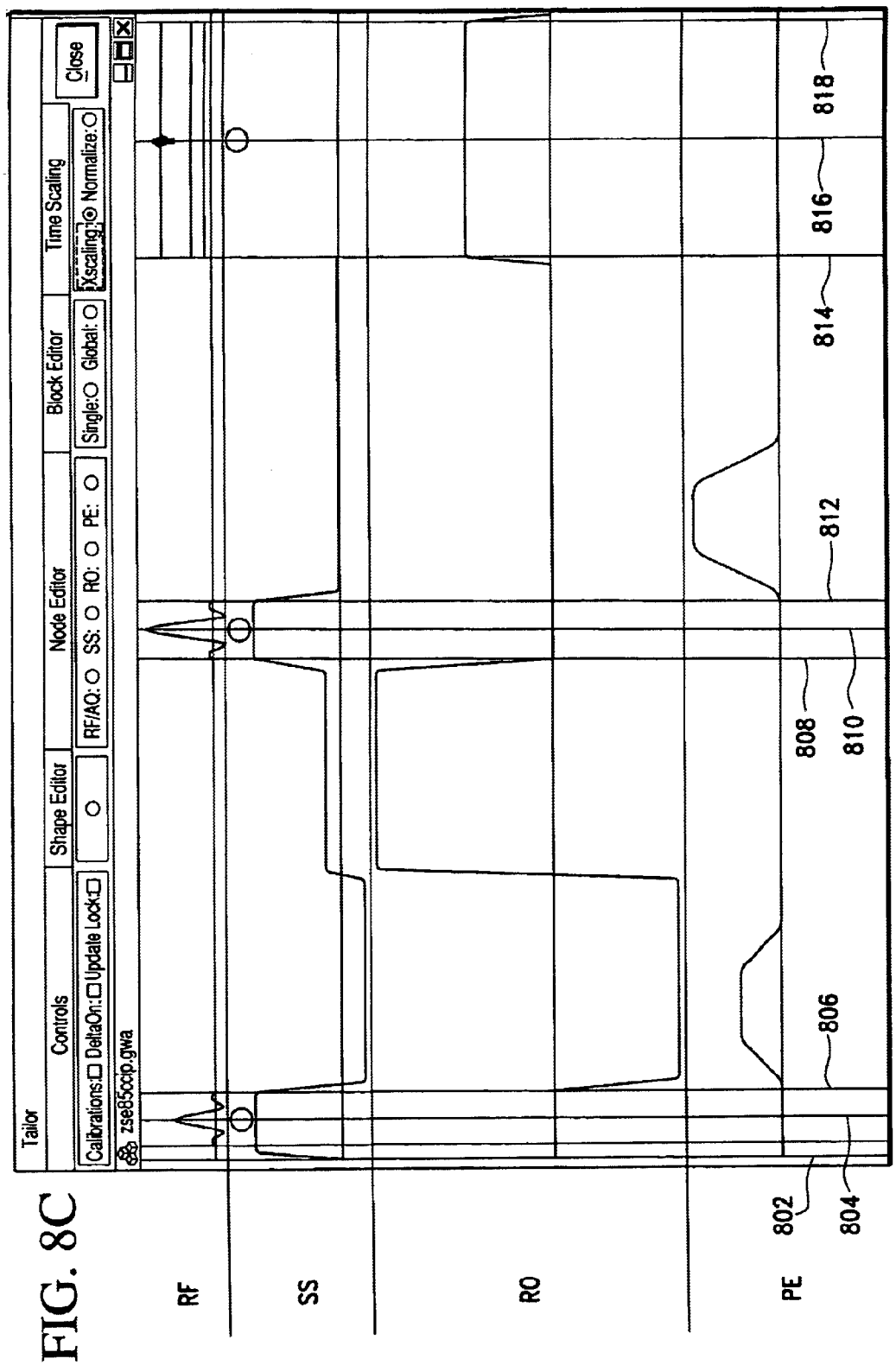

These various controls can be utilized for further plot enhancements, as illustrated in FIGS. 8A–8C. It should be understood to one skilled in the art that the aforementioned Xscaling is for the purpose of inserting new waveforms at the beginning, middle, or end of an existing waveform. Various vertical lines 802, 804, 806, 808, 810, 812, 814, 816, and 818 are displayed in response to user selection of the Xscaling radio button 622. These vertical lines pass through each of the displayed plots and assist the user in analysis of the timing relations among the RF pulse, data acquisition and gradient waveforms. An example of such timing relation is indicated in FIG. 8B. The duration of the slice plateau should be approximately equal to or slightly larger than the corresponding RF shape duration. In this illustrative example, a user can quickly make an assessment of this relation by selecting the Xscaling radio button 622 and noting the relation of the RF shape duration spanning vertical lines 802 to 806. In this instance, the SS plateau duration is slightly larger than the RF pulse duration, indicating a proper relationship. Various other timing relations can easily be confirmed, such as verification that a PE gradient occurs only during periods with no RF pulse or data acquisition, by viewing the exemplary plots as graphically displayed in the preferred user interface 305. FIG. 8c is illustrative of the vertical scaling dependency on the subject sequence.

Further controls are provided by selection of the shape editor radio button 616 in the sequence tailor dialog box 600 as depicted in FIG. 6. When this control is selected, a shape editor dialog box 900 is displayed as illustrated in FIG. 9A. This dialog box allows the user to either modify the RF shape parameters by selection of the modify parameters button 902, or modify the RF shape itself by selection of the select types button 904.

Selection of the modify parameters button 902 generates a shape modification dialog box 910, as illustrated in FIG. 9B. The shape modification dialog box 910 displays the current settings of the parameters of the selected RF shape. A user can modify the parameters associated with the current RF shape by changing the parameters to the desired value, entered by the user, of any of the displayed parameters such as amplitude of sinc 912, cycles of sinc 914, exponential of sinc 916, amplitude of cosine 918, cycles of cosine 920, exponential of cosine 922 and asymmetric factor 924. Upon acceptance of the modified parameters, the RF plot, SS plot 708, RO plot 712, and the PE plot 716 of FIG. 7 are redrawn for display accordingly.

If the user selects the select types button 904 in the shape editor dialog box 900, as shown in FIG. 9A, a shape selection dialog box 950 is displayed, as shown in FIG. 9C. A shape drop down box 952 within the shape selection dialog base 950 displays the current selected shape. By selecting the drop down arrow 954, the shape drop down box 952 expands to provide the user with a selection of available RF shapes, such as Gausian, Gasico, Hermite, etc. Selection of a RF shape different than the current RF shape will result in the RF plot, SS plot 708, RO plot 712, and the PE plot 716, being redrawn for display upon return to user interface 305. Preferably, prestored numerical shape files may be accessed through selection of the shapes available via button 956.

When a sequence is created and modified, it can be saved with the original user-assigned name by selection of the Save item (not shown) provided by selection of the File menu editor item 340, as illustrated and described in connection with FIG. 3. Alternatively, a new name can be assigned by choosing the Save As item from the File menu editor item 340. In either case, the saved sequence is digitally stored in, preferably, a plurality of files, each of which defines a particular aspect of the saved sequence. These files are preferably stored within a storage device of computer 110, as illustrated in FIG. 1. In a preferred embodiment, there are eleven files created and saved when a user chooses to save a given sequence. These files include seven binary files for input to the various DACs described hereinabove, as well as a documentation file, e.g., a MS Word document (.doc), a source file such as a C++ file (.cpp) and a graphical file for sequence plotting such as a .gwa file. The seven binary files for directing the DAC operations can be combined into a single file to reduce the number of stored files. The documentation file preferably provides all the numerical values describing the sequence including a report on various critical values related to the sequence and the overall system, e.g., maximum rising time and electrical currents of the associated gradient.

Figure 10A:
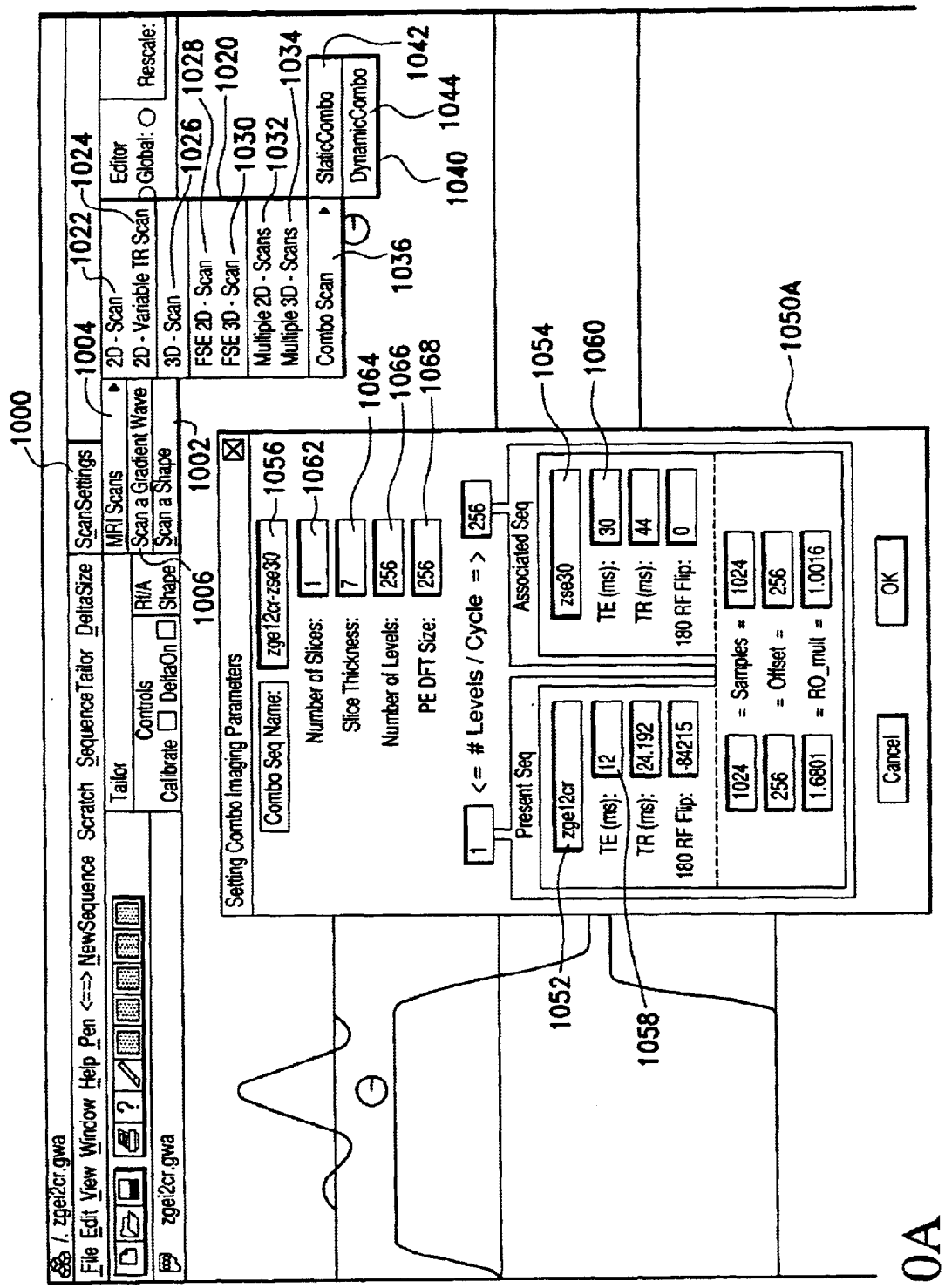
FIGS. 10A, 10B, and 10C illustrate an imaging parameters dialog box for displaying and accepting modifications to various imaging parameters.

After a sequence is designed and stored, an MRI scan is available to be performed. This is initiated through selection of the ScanSettings menu editor item 1000, as illustrated in FIG. 10A. The ScanSettings menu editor item 1000 is included in the main menu of the primary design interface 300 but only the ScanSettings 1000 menu editor item and its associated drop down menus 1002, 1020, and 1040, and a Setting Combo Imaging Parameters dialog box 1050A are illustrated in FIG. 10A. When the ScanSettings menu editor item 1000 is selected, the ScanSettings drop down box 1002 is displayed and provides the user with a selection of scan parameters to perform a scan.

In the illustrative example, the MRI Scans option 1004 is selected and causes the MRI scan type drop down menu 1020 to be displayed. Eight different types of scans are illustratively available for selection, e.g., 2D-Scan 1022, 2D-Variable TR Scan 1024, 3D-scan 1026, FSE 2D-scan 1028, FSE 3D-scan 1030, Multiple 2D-Scans 1032, Multiple 3D-Scans 1034, and Combo Scan 1036. It should be understood, however, that the number and type of available scans is not limited to the illustrative examples depicted.

If a scan type selected does not have an associated sequence type already loaded as aforedescribed, an error message is generated and displayed to the user indicating the absence of the desired sequence type. Additionally, the error message is generated to remind the user that the desired scan did not match the type of sequence. A simple example of the image parameter setting is illustrated in FIG. 10C. A Setting Imaging Parameters dialog box 1080, as illustrated in FIG. 10C, is displayed upon selection of MRI Scans type having an associated sequence type already currently loaded. The Setting Imaging Parameters dialog box 1080 also displays numerous other parameters which are listed above with reference to FIG. 10A. The default settings are displayed consistent with the sequence already displayed in the user interface 305. In the illustrative example of FIG. 10A, the Combo Scan option 1036 is selected, which activates the display of a combination type drop down menu 1040. The user may want to perform the combo scan 1036 when performing a coronary MRA or MRI guided surgery. In the preferred embodiment, a user may choose between a StaticCombo scan 1042 and a DynamicCombo scan 1044. When the StaticCombo scan 1042 is selected, as illustrated in FIG. 10A, the Setting Combo Imaging Parameters dialog box 1050A is displayed. In this illustrative example, the first sequence denoted in a first sequence name box 1052 is used for an extremely fact detective scan, whereas the second sequence denoted in a second sequence name box 1054 is used for actual imaging. The name of the combination of sequences is preferably provided in a sequence name box 1056. A default first sequence echo gathering time parameter 1058, and a default second sequence echo gathering time parameter 1060 are also displayed. Various other imaging parameters are preferably provided, e.g., number of slices 1062, slice thickness 1064, sequence repetitions, number of phase encoding levels 1066, Discrete Fourier Transform (DFT) size 1068, and 180 RF polarity flipping. These displayed parameters are exemplary only and can be tailored according to the software designer's preference. The numerical values associated with the various displayed parameters are modifiable by the user by simply entering different values from the defaults and accepting the entered values by selection of the OK button. Upon acceptance of the default values, or values substituted therefor, two files (.va and .exam) are preferably generated and saved accordingly. These files provide information for proper setting of sequences, scan and image reconstruction required for the various imaging components.

Figure 10B:
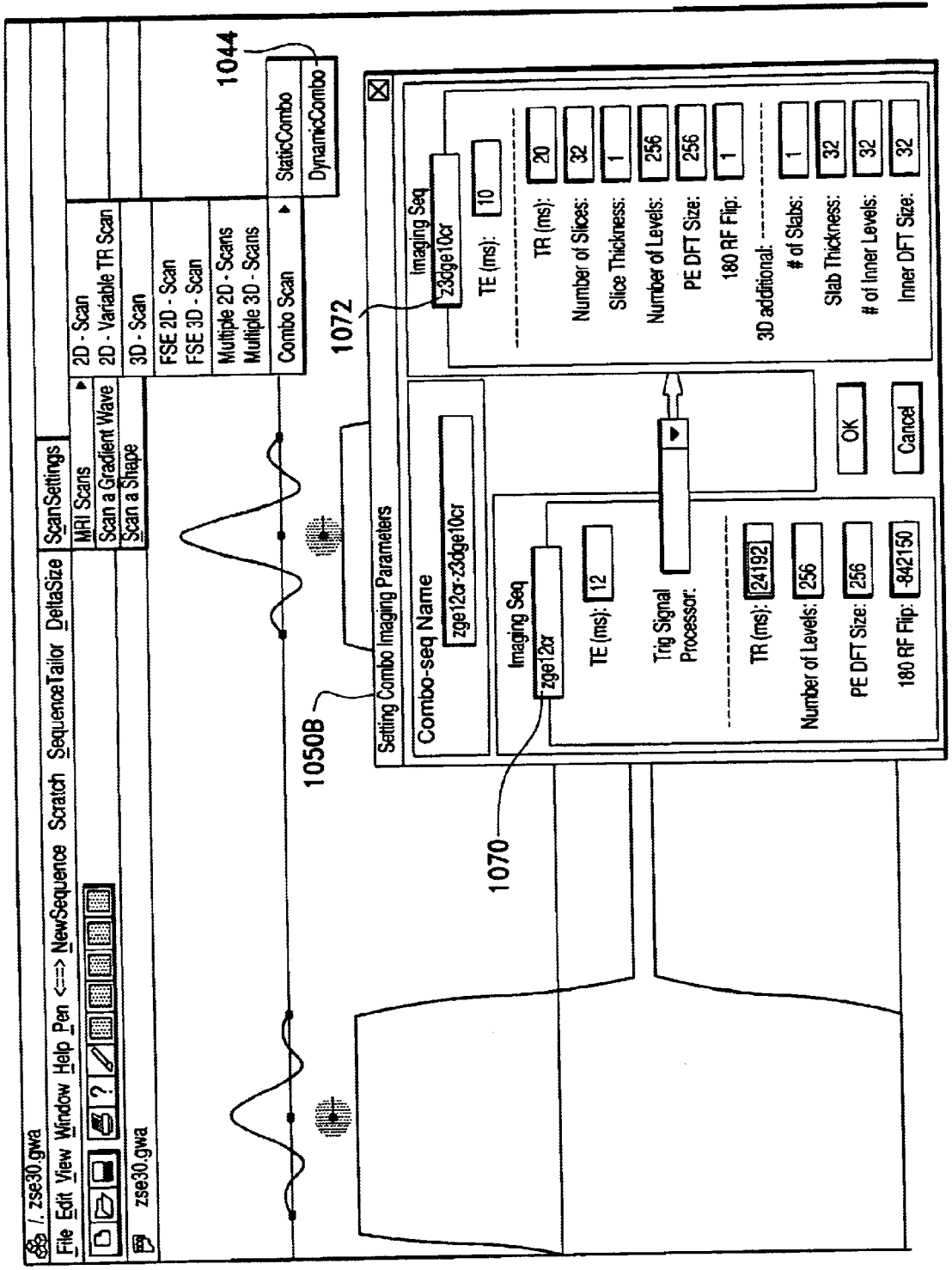
Figure 10C:
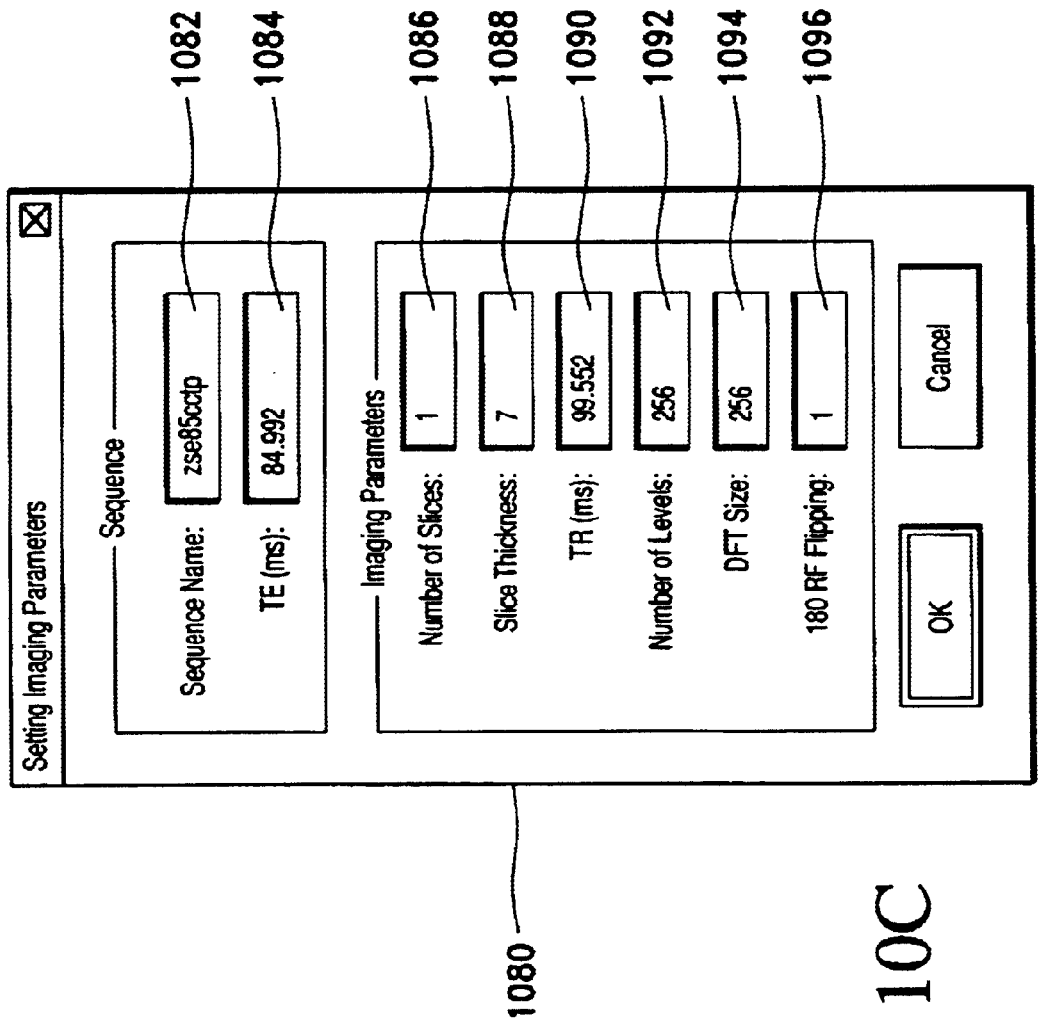

A Setting Combo Imaging Parameters dialog box 1050B, as illustrated in FIG. 10B, is displayed when the user selects to perform a DynamicCombo scan 1044. The trigger sequence used is denoted in a trigger sequence name box 1070, and the imaging sequence used is denoted in a imaging sequence name box 1072. Various other parameters, such as those listed above with reference to FIG. 10A, are also displayed in the Setting Combo Imaging Parameters dialog box 1050B.

Figure 11:
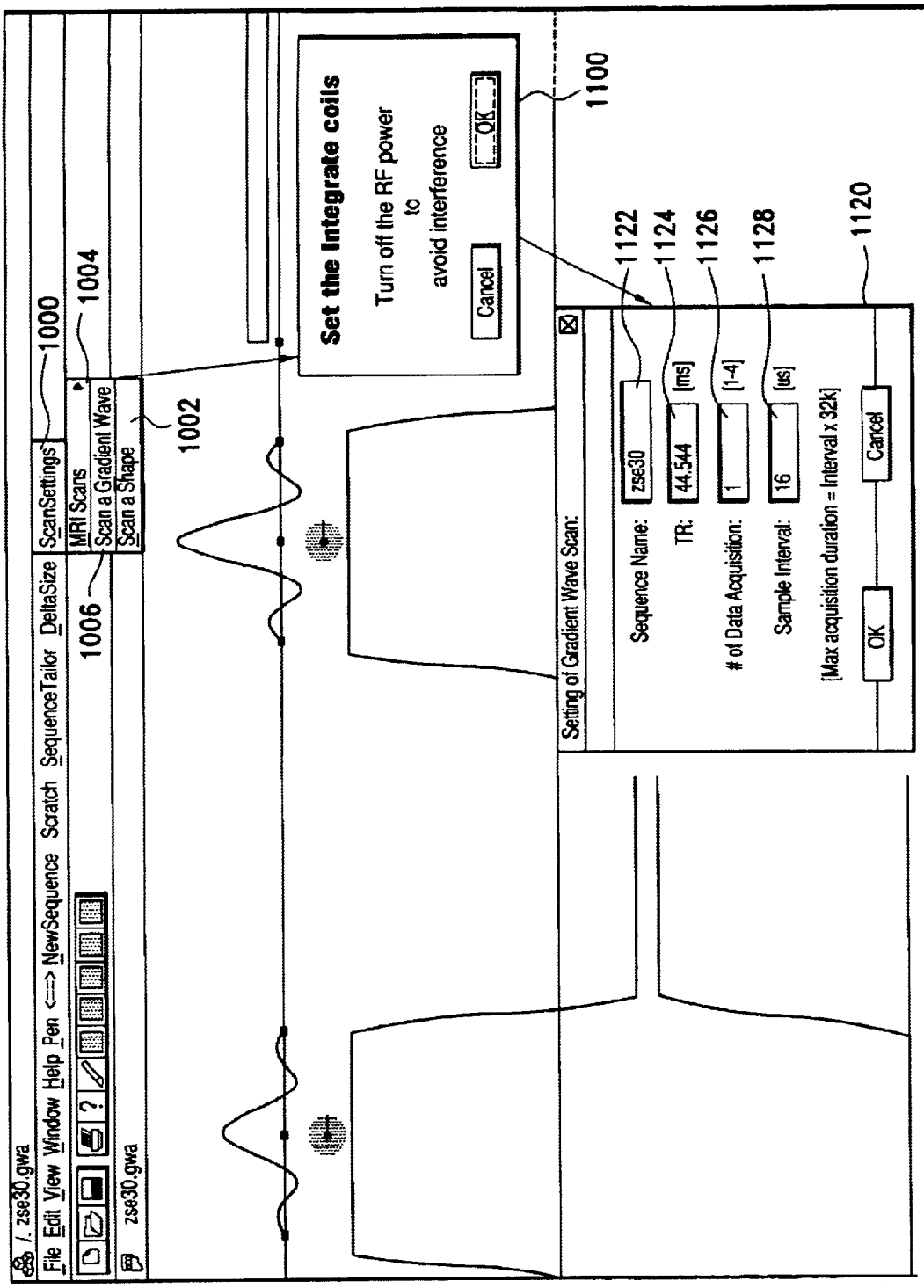
FIG. 11 illustrates a scan gradient wave option box and displayed parameters.

FIG. 11 illustrates a preferred embodiment of the present invention when a Scan a Gradient Wave option 1006 is selected from the ScanSettings menu editor item 1000. The ScanSettings drop-down box 1002 and the MRI Scans option 1004, as described hereinabove in connection with FIG. 10A, are shown for illustration. Upon selection of the Scan a Gradient Wave option 1006, an interference dialog box 1100 is displayed. Selecting the OK button on the interference dialog box 1100 causes a Setting of Gradient Wave Scan dialog box 1120 to be displayed. The Setting of Gradient Wave Scan dialog box 1120 allows a user to enter a particular window location and size with which to compare the input and output retrieved from the magnetic field. The user may enter values in a variety of parameter boxes, e.g. a sequence name box 1122, a sequence repetition times box 1124, a number of data acquisition box 1126, and a sample interval box 1128.

Figure 12:
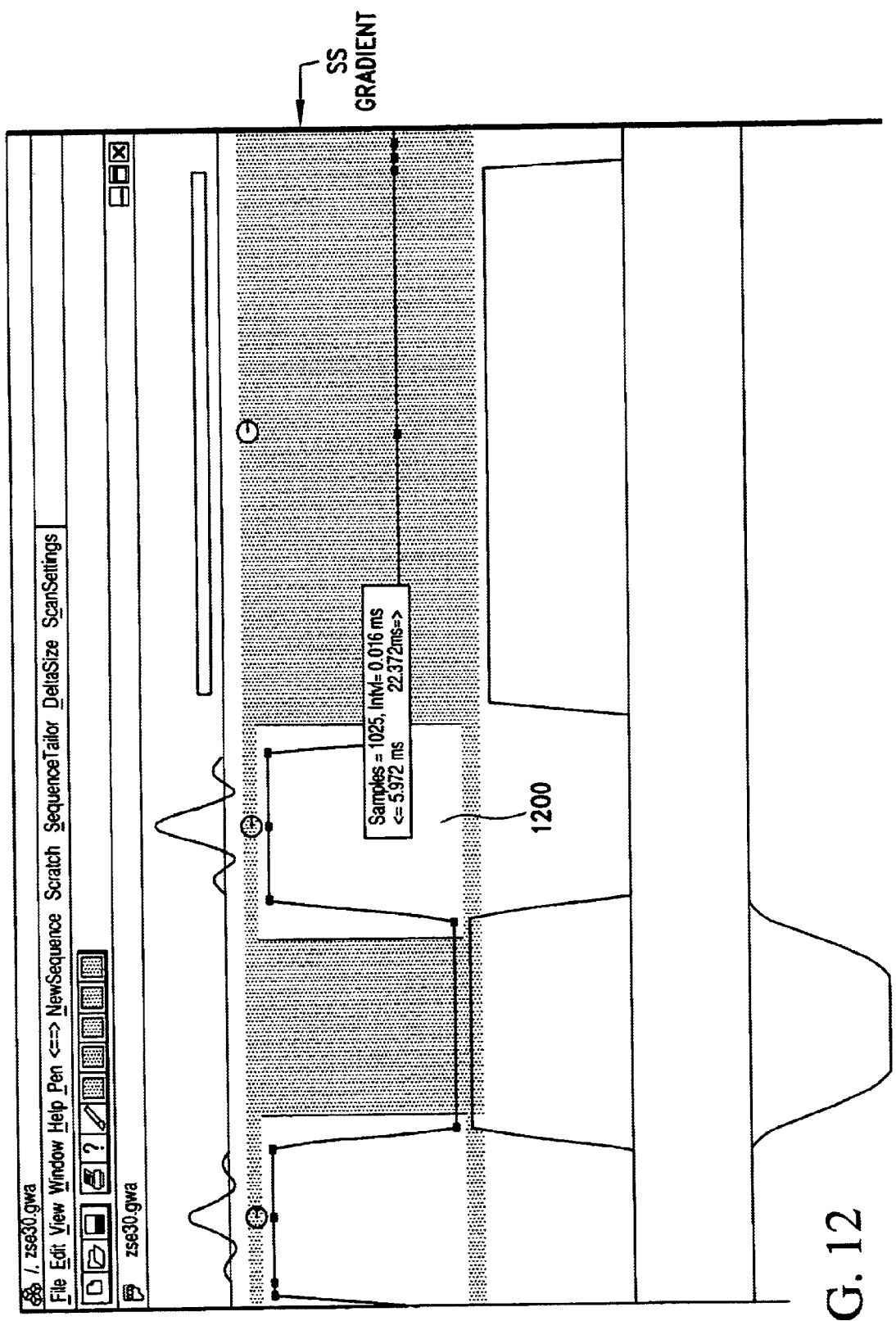
FIG. 12 is an exemplary graphical representation of a variable window used in accordance with the Gradient Wave Scan dialog box of FIG. 11.

FIG. 12 illustrates an exemplary graphical representation of a variable window 1200 which can be selected in the Setting of Gradient Wave Scan dialog box 1120 in FIG. 1. In this example, the user selected the SS gradient with a sample interval 1128 of 16 microseconds. One skilled in the art will recognize that the settings pertaining to FIG. 12 are for illustrative purposes only. The user may select a number of other gradients to compare, and may select a variety of other sample intervals.

Figure 13A:
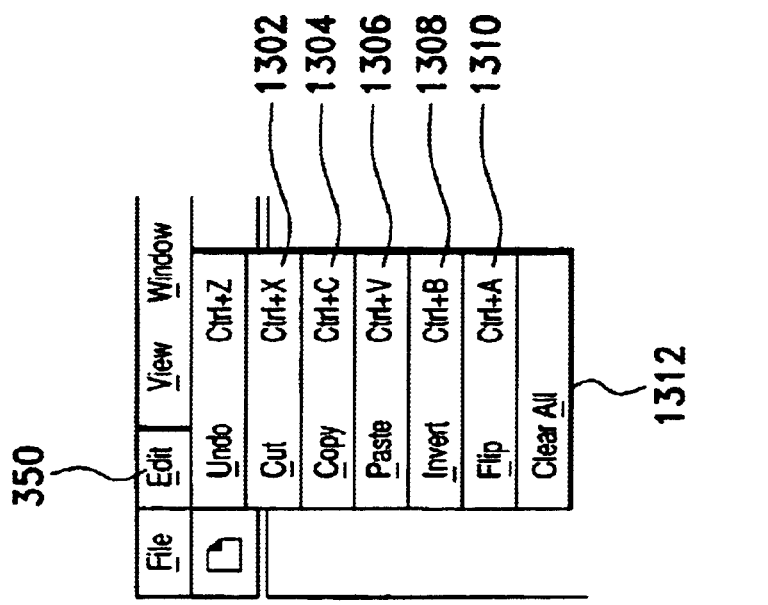
FIGS. 13A and 13B illustrate plot editing commands available for modifying and design of a pulse sequence.
Figure 13B:
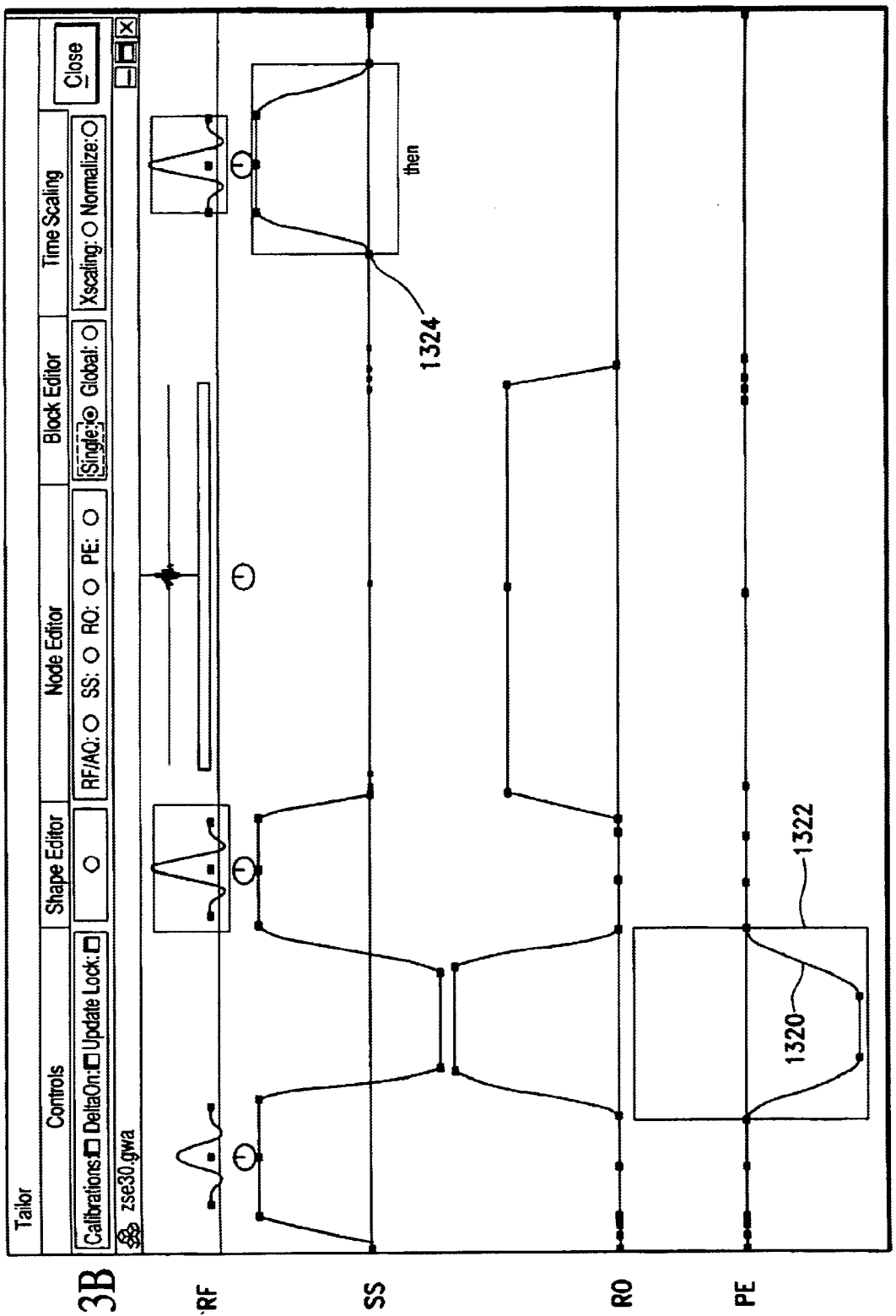

The present invention also allows for 'cut' 1302, 'copy' 1304, 'paste' 1306, 'invert' 1308, and 'flip' 1310 procedures to further expedite sequence design and modification as may be better understood with reference to FIGS. 13A and 13B. FIG. 13A simply illustrates the user's access to the above-mentioned procedures by selection of the Edit menu item 350. FIG. 13B provides an illustrative example of the various plots associated with a given sequence and an exemplary illustration of a copy procedure to expedite a sequence modification. On the PE plot 1320, a waveform has been selected for copying as indicated by a shaded selected area 1322. Generally, selecting an area is accomplished through clicking and dragging the desired area 1322 with the pointer device 140. The contents of the selected area 1322 are next copied to the computer 110 memory by choosing the Edit menu item 350 followed by the Copy 1304 command from the Edit drop down menu 1312 of FIG. 13A. Once the contents are copied to the computer 110 memory, the user may then select a point in one of the displayed plots, for example, point 1324 at which to paste the copied waveform. As illustrated, the waveform pasted at point 1324 is an inversion of the original copied waveform. This is accomplished by selection of the invert command 1308 from the Edit menu item 350 after the paste procedure. Thus, by this method, an FSE sequence, for example, can be designed from duplicating the parts of a generic SE sequence. It should be noted that, as illustrated, it is not necessary that a waveform be copied from the same plot.

An important innovative aspect of the present invention is the capability for real-time communication between the MRI scan controller 130 and the scanning hardware, e.g., MRI unit 150, allowing for immediate design modifications and corresponding visual feedback. In the current preferred embodiment, seven binary files corresponding to the graphic waveforms on the screen have been generated. The seven binary files correspond to the preferred seven DACs, the gradient DACs 240, 242, and 244, the RF shaper DACs 250 and 252, and the synthesizer DACs 231 and 232 interfacing the MRI control system, the computer 110, with the MRI scanning hardware. Thus, two binary files exist for synthesizers, two for shapers, and three for the gradients. Utilizing seven binary files for real-time communication between the MRI hardware and control system is only a preferred embodiment of the present invention. As previously mentioned, the system and method are not, however, limited to such an arrangement but can be extended or reduced to any number of DACs depending upon the actual system on which the present invention is applied.

In order to provide real-time design and feedback, an accurate time frame reference is needed to be established. Since all of the digital electronic devices in the overall MRI system accept integer values generally limited by the bit-size of the associated DAC, small errors can accumulate during operation due to round-off of input data from various assignments and calculations when the sequence is built. This may sometimes lead to serious consequences for proper realization of a MRI pulse sequence. Thus, it is particularly important for a real-time interactive system, as described herein, to provide verification and round-off correction procedures between the displayed graphics and all the DACs to ensure time alignment throughout the entire sequence design process. The timing error due to roundoff depends on the settings of the time-resolution, generally on the order of microseconds, in the hardware. However, the accuracy of all calculations and roundoff subroutines in the user interface is preferably on the order of a single nanosecond. Every piecewise segment of the waveform is rounded off to be an integer-multiple of the three different time units, i.e., the unit for the RF pulses, the unit for the gradient waveforms and the unit for the sampling rate. Potential conflicts among the three time coordinates are resolved prior to the integral conditions, i.e. the gradient waveform specifications required to produce an echo, being applied. In a preferred embodiment of the present invention, satisfaction of the integral conditions are performed automatically by the underlying algorithm. This occurs not only at the initial sequence design stage, but also during gradient waveform modification, for example. Thus, the present invention provides a dynamic response to the user's adjustment by dynamic calculation and adjustment for satisfaction of the requisite integral conditions, e.g., by input via mouse 140 such as dragging of the gradient for modification thereto or by delta tuning.

Figure 14A:
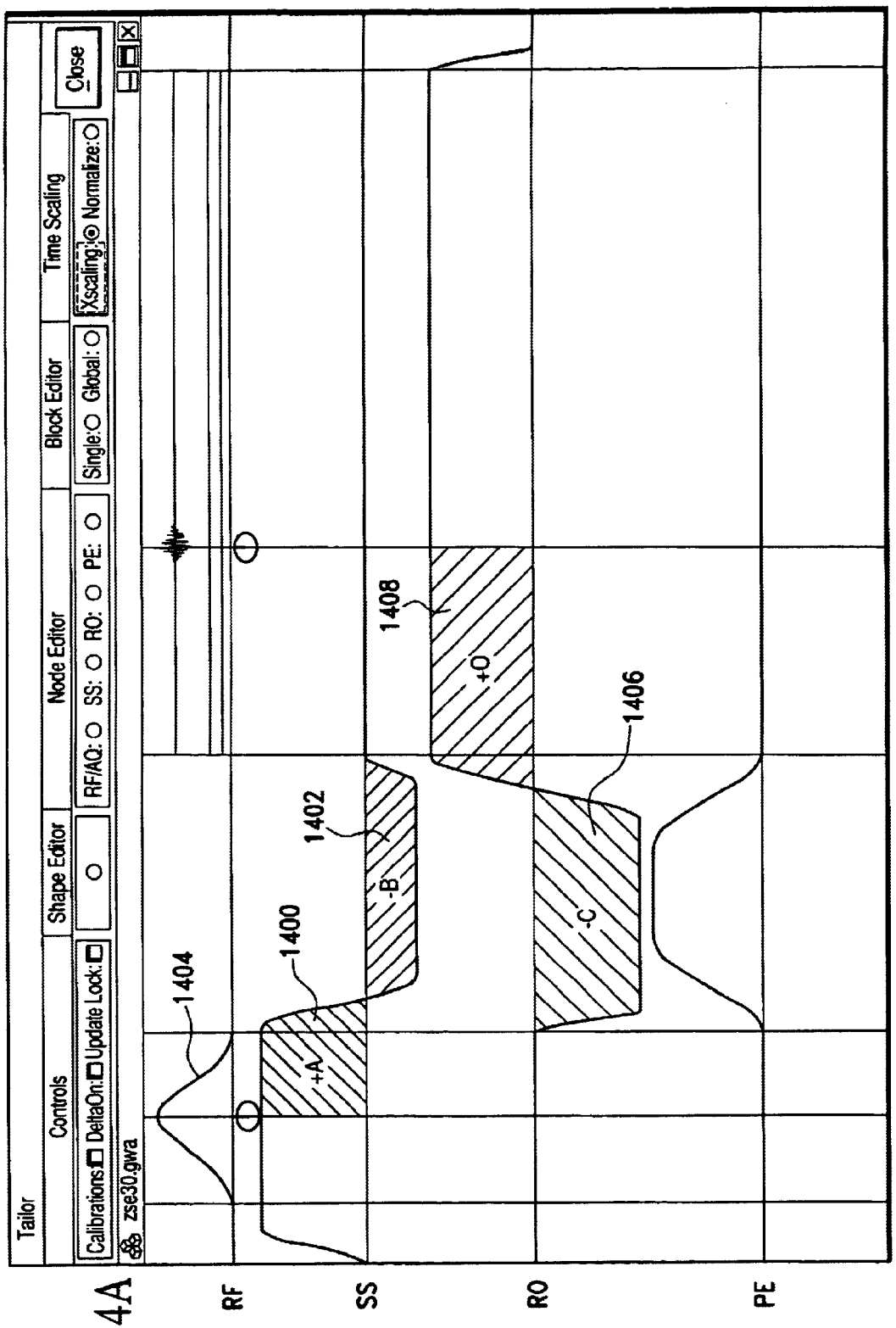
FIGS. 14A and 14B illustrate an exemplary embodiment of integral condition calculations according to a preferred embodiment of the present invention.
Figure 14B:
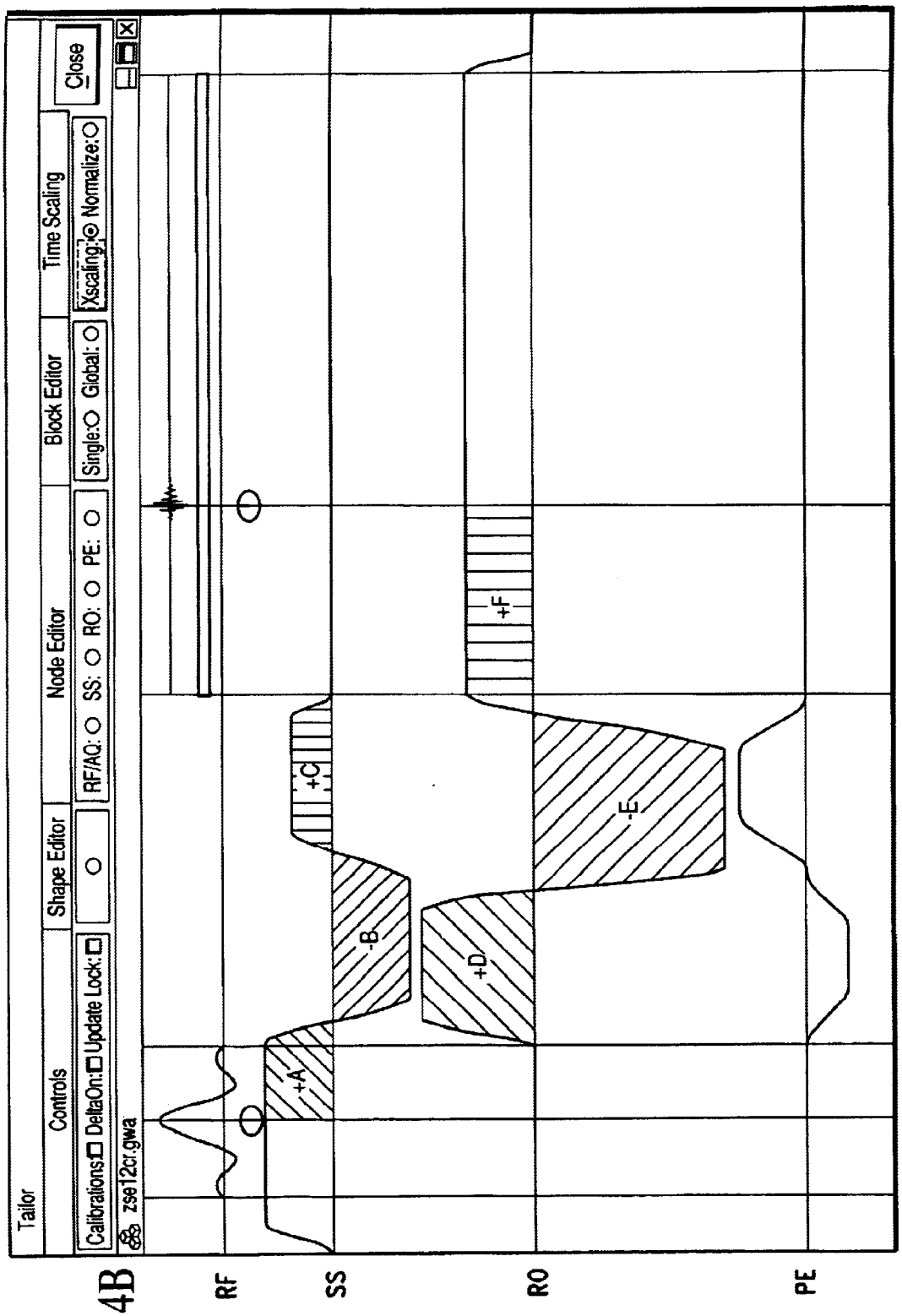

Satisfaction of the integral conditions, as had by the present invention, may better be understood with reference to FIGS. 14A and 14B. To obtain the largest echo amplitude, both the SS and RO gradients must satisfy the corresponding integral conditions. For the SS integral condition, the time integrated area of SS area 1400 must be equivalent to the time integrated area of SS area 1402. This is because the protons excited by the RF pulse 1404, dephase during the time period of SS area 1400 and subsequently rephase during the span of time corresponding to the SS area 1402. Similarly, the time integrated area of RO area 1406 must be equivalent to the RO area 1408.

To refocus the spins that are in motion, higher order integral conditions are required. This scenario is illustrated in FIG. 14B. In this illustration, a gradient sequence that has both stationary spins and spins moving in constant velocities are refocused at the time of the echo center, i.e. the signal components contributed by the spins in constant velocities are included in the image instead of, as would occur otherwise, the motion artifacts. Calculation of the integral condition for a particular sequence comprises the solution of a set of simultaneous integral equations depending on the order of compensation. As noted above, these integral conditions are calculated, and the sequences are modified accordingly, both at the initial sequence design and dynamically as modifications are being made to a sequence.

Figure 15A:
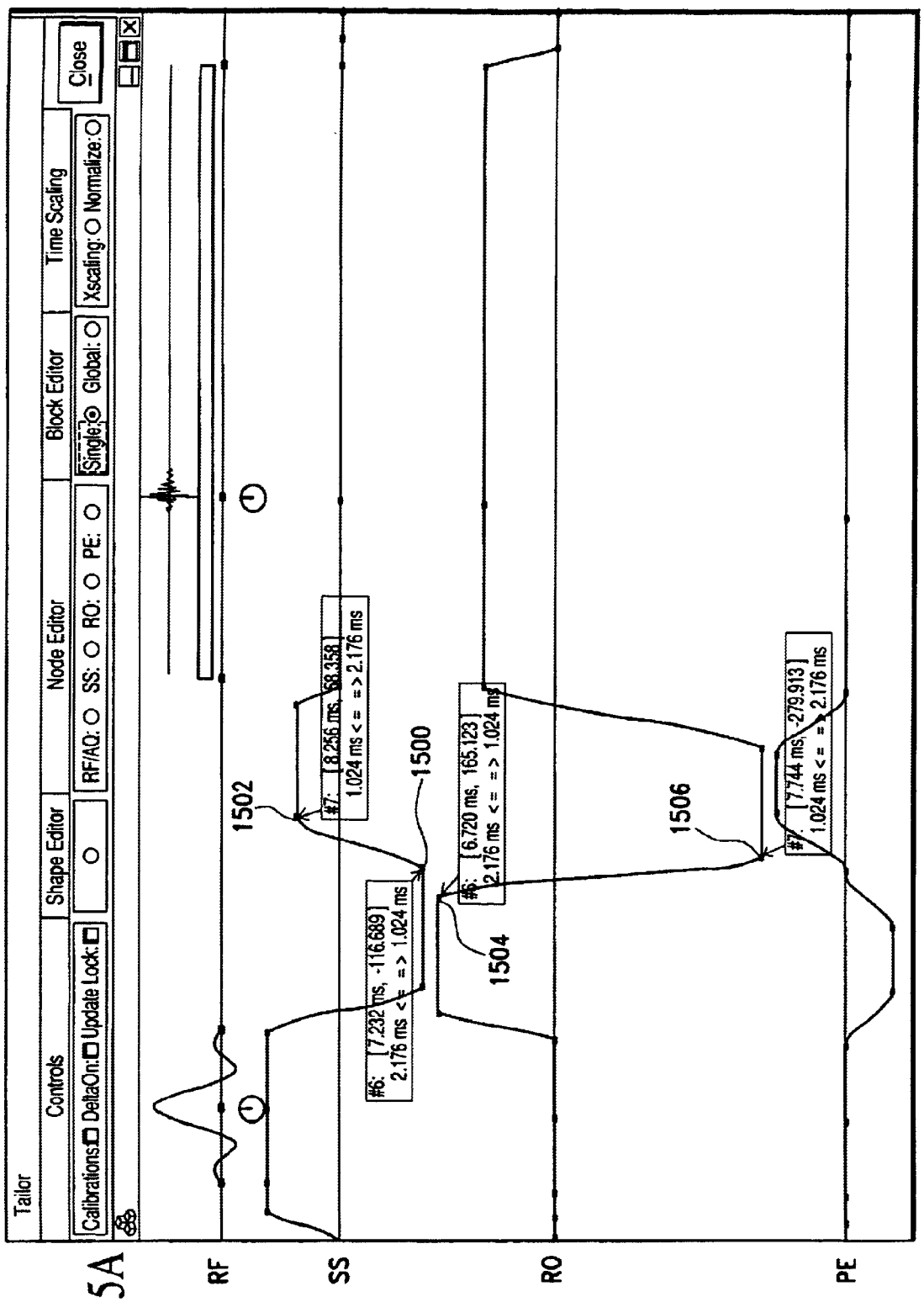
FIGS. 15A and 15B provide further illustration of the automated integral conditioning of the present invention.
Figure 15B:
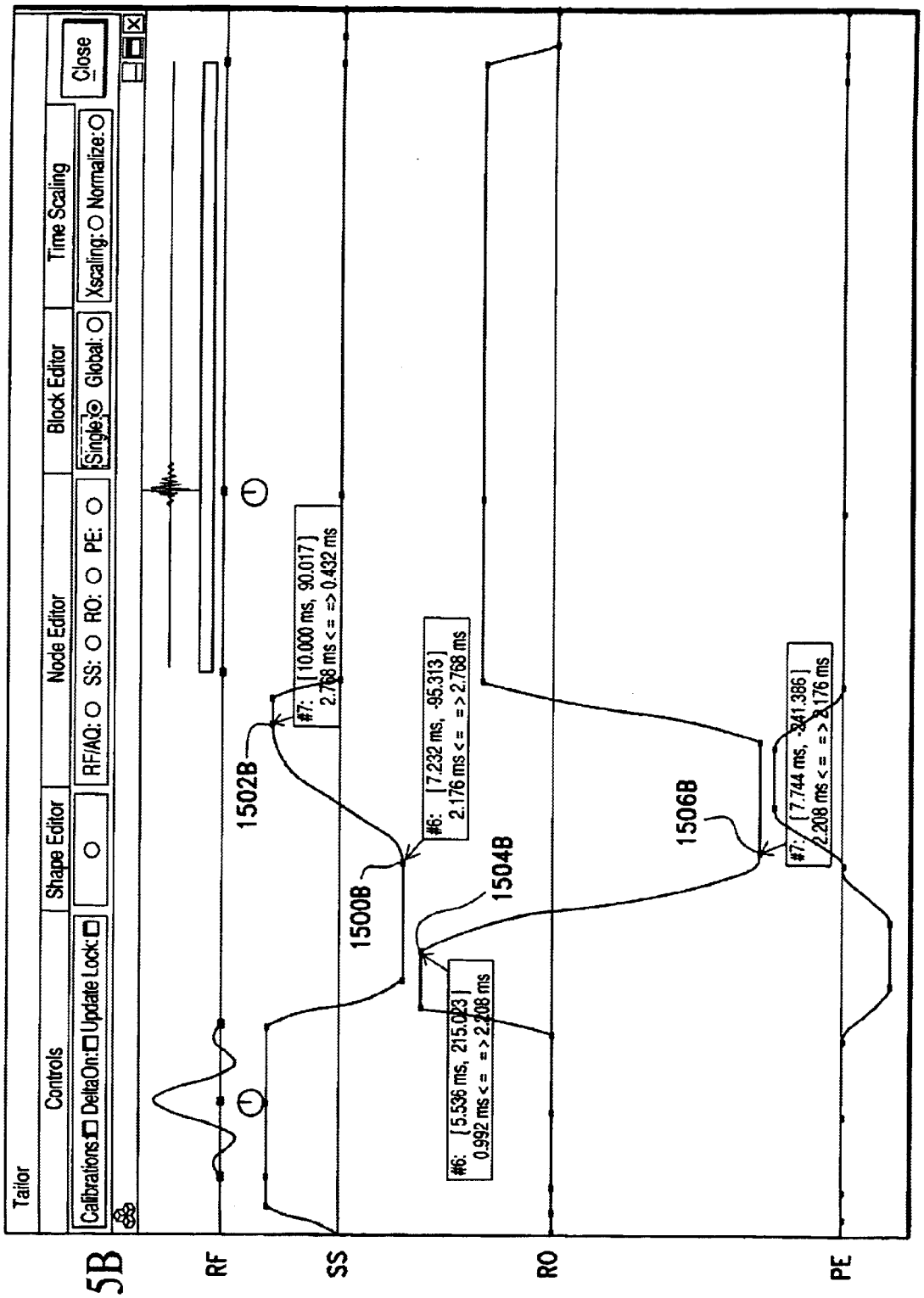
Figure 16A:
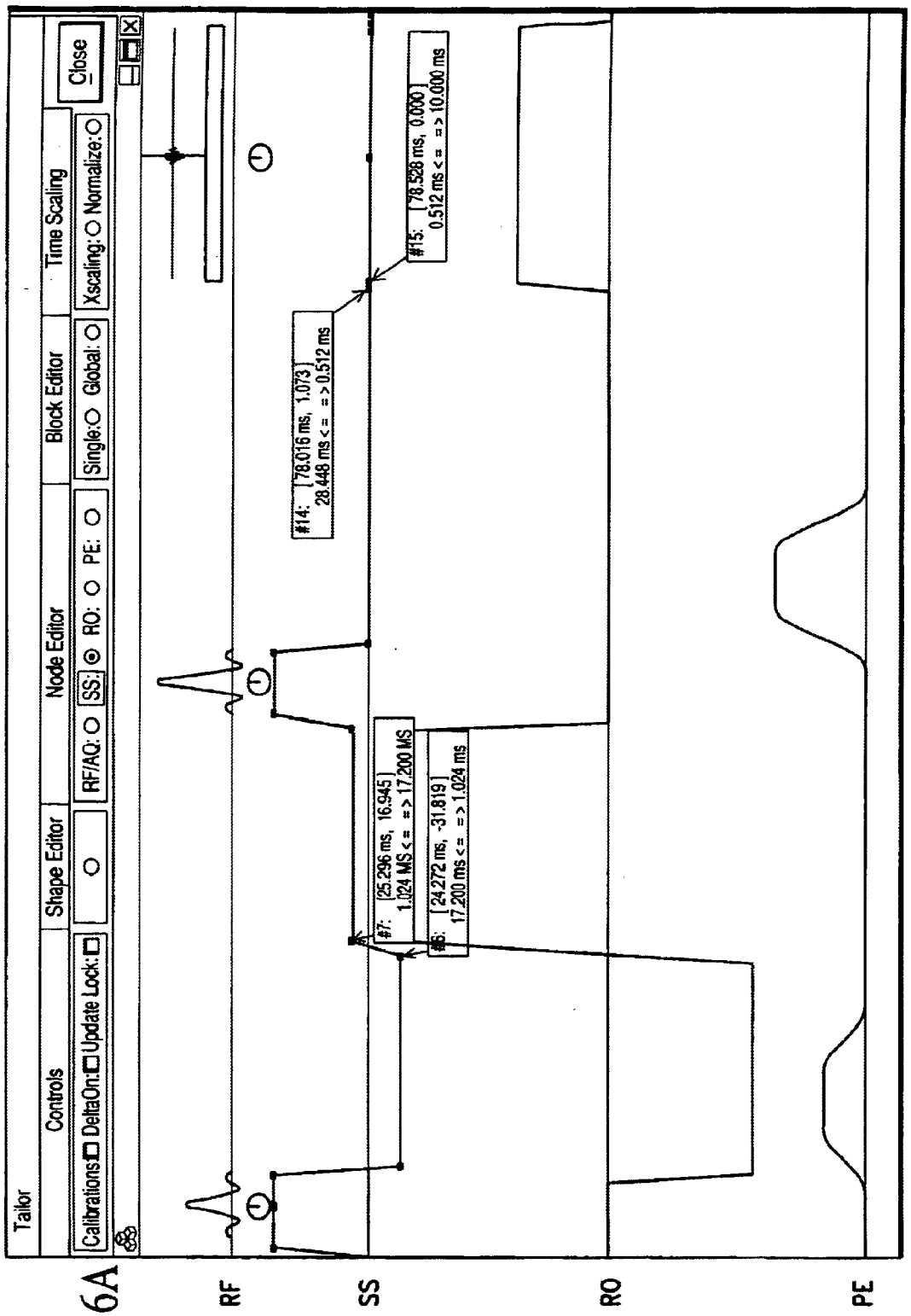
FIGS. 16A through 16D provide illustration of acceleration compensation in a slice select (SS) gradient, velocity compensation in signal recognition (RO) and automatic integral conditioning thereof.
Figure 16B:
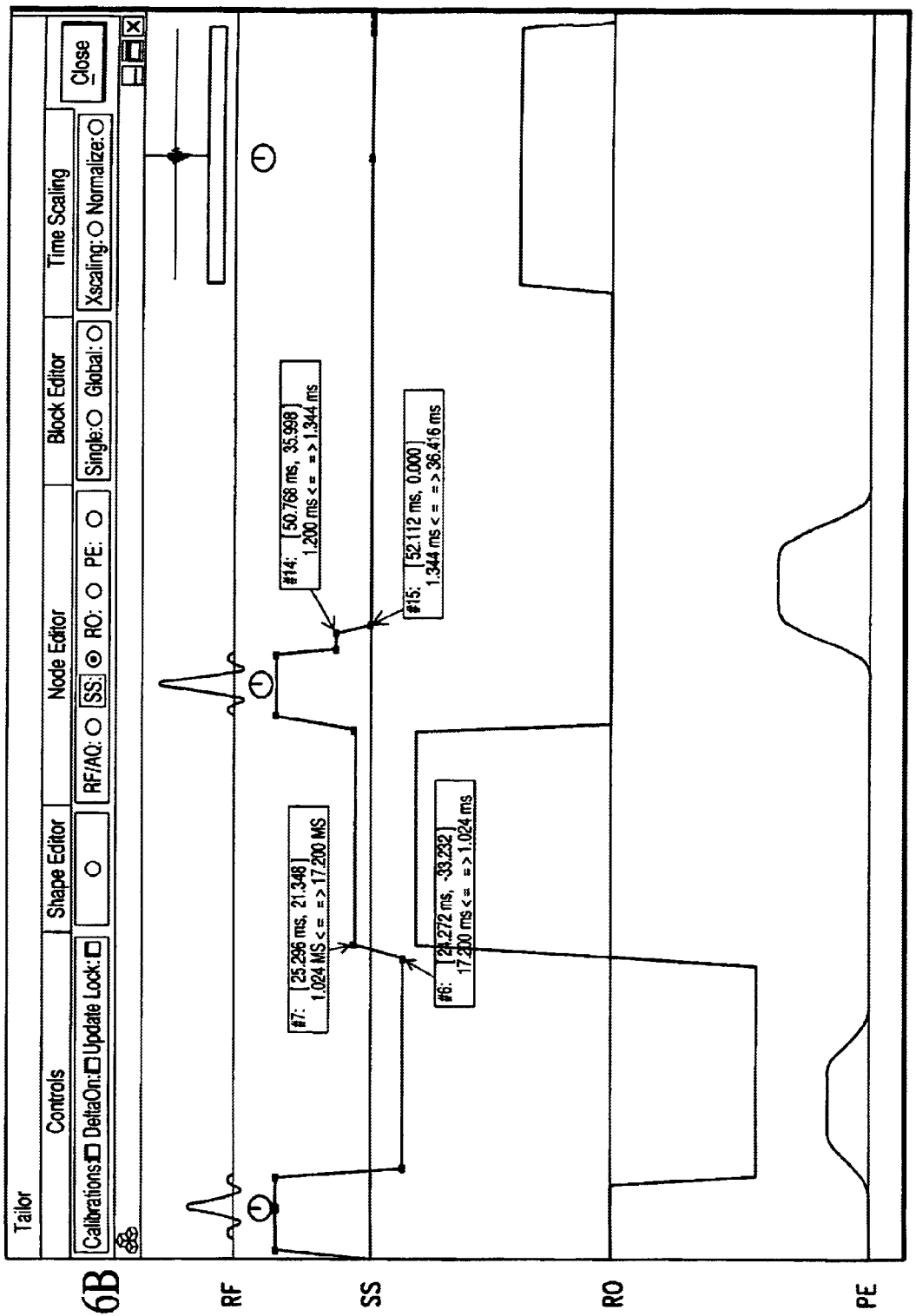
Figure 16C:
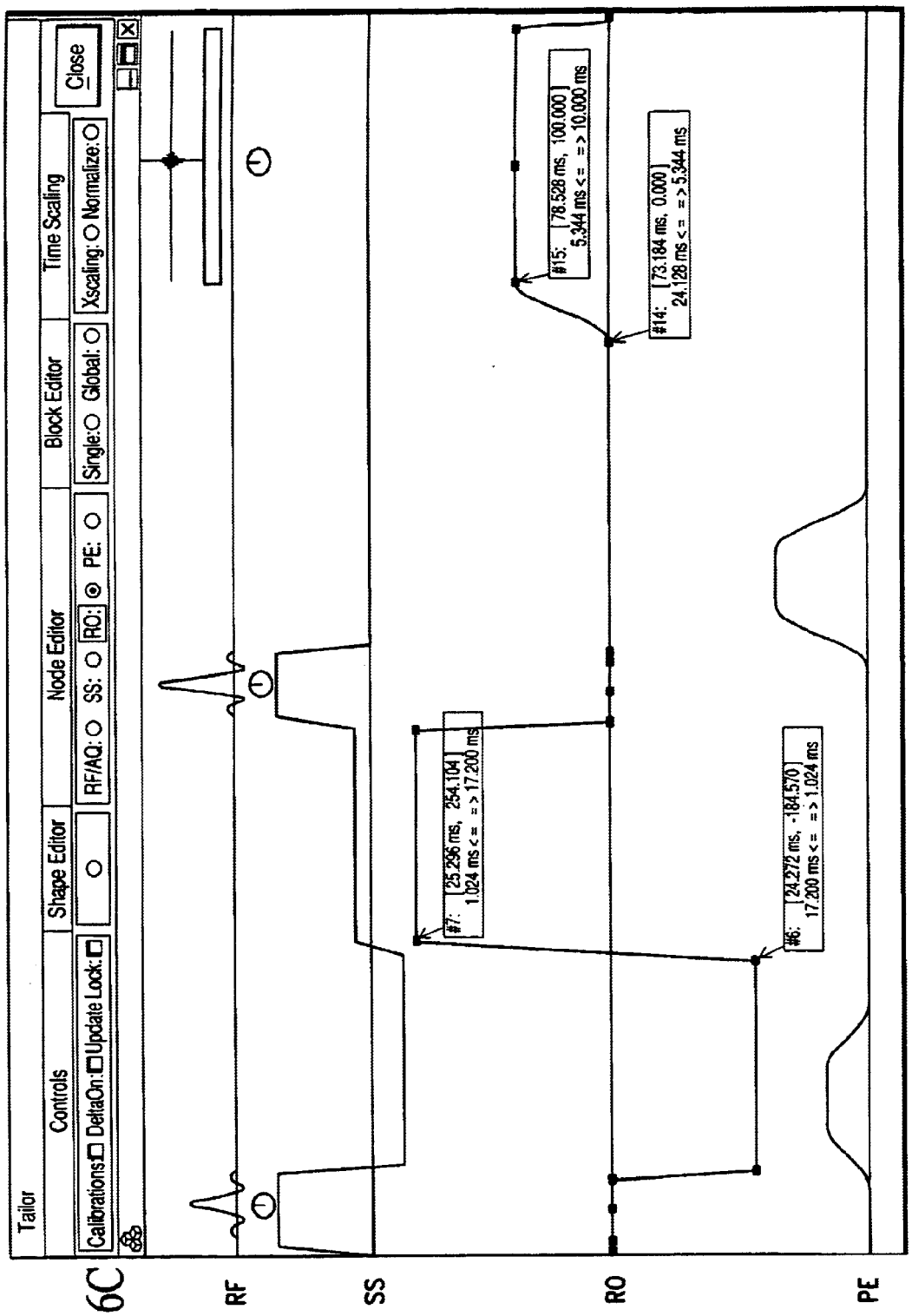
Figure 16D:
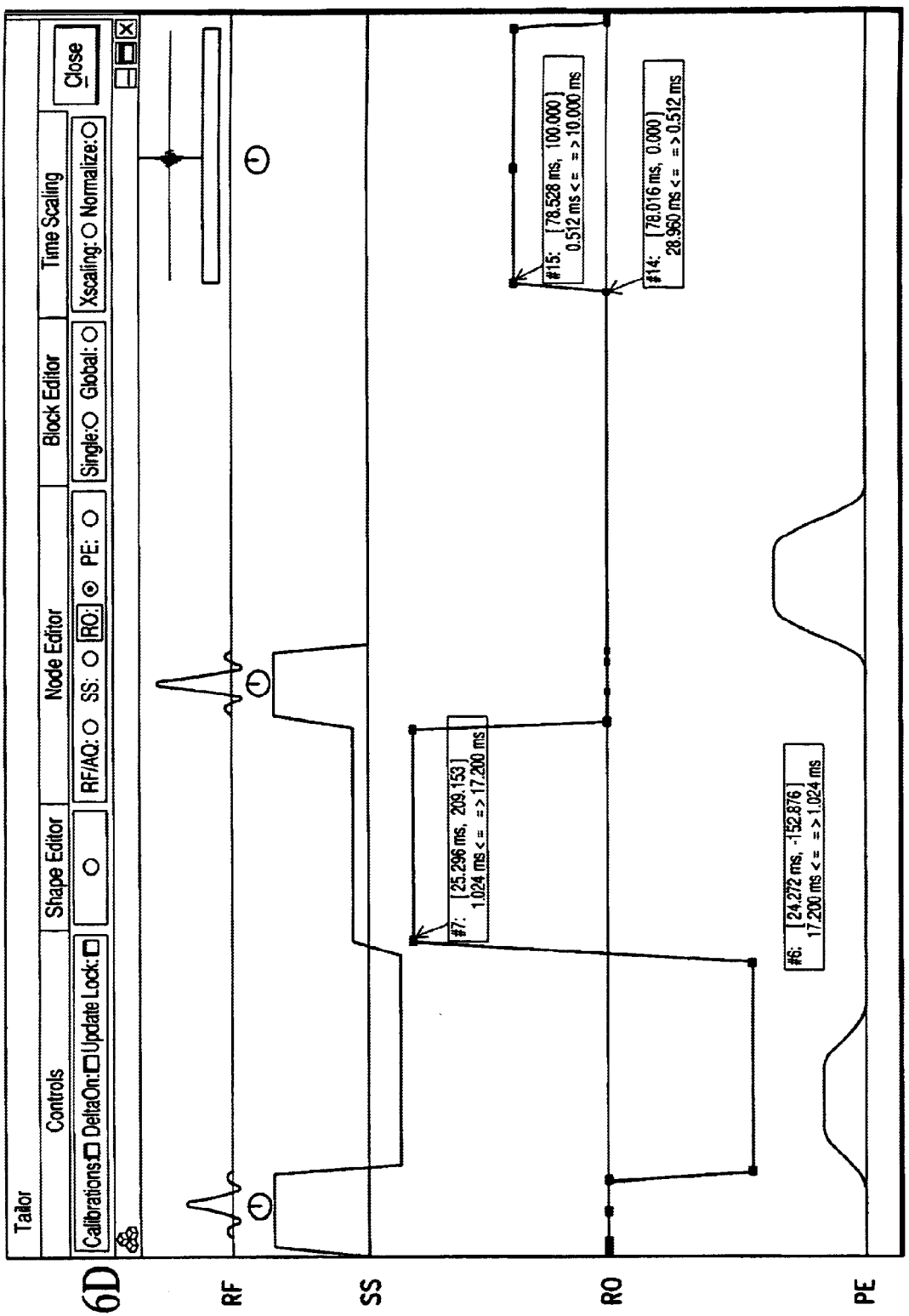

In FIG. 15A is illustrated a gradient sequence with velocity motion compensation for both the SS and RO gradients. The default timing settings of SS nodes 1500 and 1502 and RO nodes 1504 and 1506, are also illustrated. For the SS gradient, the time and amplitude of node 1500 are initially 7.232 ms and −116.689, respectively, while the time and amplitude of node 1502 are initially 8.256 ms and 58.358, respectively. The SS gradient was then modified by dragging node 1502 to a timing position of 10.000 ms, denoted node 1502B in FIG. 15B. In order to satisfy the integral condition such that the resulting echo will be formed at a substantially identical position as an echo resulting in the non-modified SS gradient as illustrated in FIG. 15A, the SS gradient must be modified. This modification is apparent in FIG. 15B by the amplitudes of nodes 1500B and 1110B automatically adjusting to −95.313 and 90.017, respectively so that the integral conditions are still satisfied. Similarly, in FIGS. 15A and 15B, node 1504 of the RO gradient has been dragged from an initial time of 6.720 ms to 5.536 ms. The immediate response displayed in the user interface is an adjustment of amplitude of RO node 1504 from 165.123 to 215.023 (indicated as node 1504B) and an adjustment of RO node 1506 amplitude of −279.913 to −241.386 (indicated as node 1506B).

In FIGS. 16A through 16D is illustrated a spin echo sequence example depicting motion compensation of the SS gradient for acceleration and RO for velocity compensation.

As described, the present invention is generally composed of two portions: the graphical user-interface and the real-time MRI interface, or front-end. The real-time MRI interface allows communication between the graphical user-interface, and thereby the user, with the system hardware. The primary task of the front-end is to translate the output, e.g., the seven binary files, of the graphical user-interface into the data format required for input to the hardware and MRI controller and to retrieve the digitized signal from the system for either display in proper graphical form or delivery back to the user-interface for interaction purposes. Three types of analyzers for handling the three different kinds of signals, i.e. MRI signals, gradient waveforms and RF shapes, received from inside the aperture 155 are required. All three analyzers require the real-time feedback and capabilities for a fully real-time and interactive MRI process.

Figure 17:
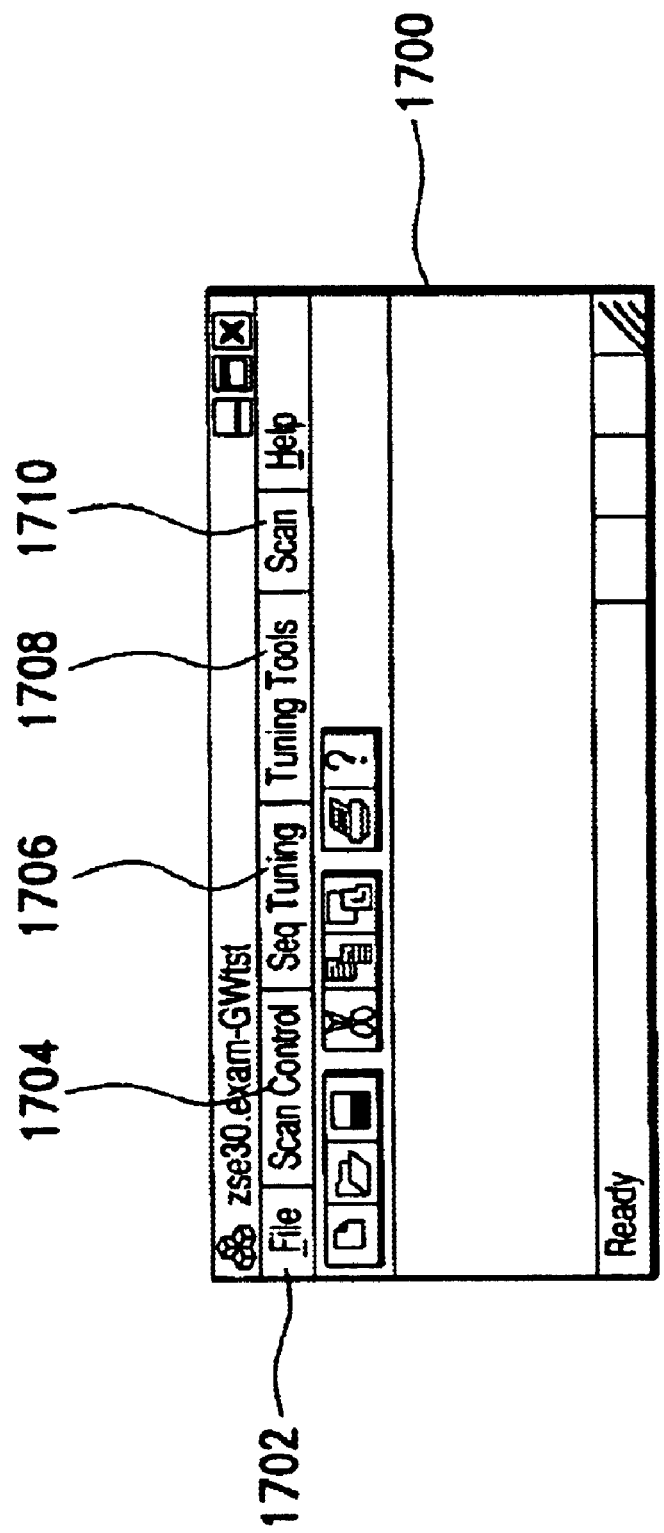
FIG. 17 illustrates a secondary window invoked at real-time interfacing initiation.

Accordingly, a second window (in addition to the aforedescribed primary user interface 300 window, and the various manifestations thereof) is created when the real-time interface is invoked and is illustrated in FIG. 17.

Second window 1700 contains various menu editor items, e.g., File 1702, Scan Control 1704, Seq Tuning 1706, Tuning Tools 1708 and Scan 1710. When a sequence is created along with the corresponding exam and .va files, as described hereinabove, the sequence can be selected by the options available (not shown) through the File menu editor item 1702. In order to generate and receive the MRI signal, several system parameters have to be tuned properly for the loaded sequence. These parameters include, for example, the settings of the central frequency of the magnet 170, the power gain of the RF amplifier, the gain of the receiver, etc.

Tuning of these parameters is performed through a scan control dialog box which is invoked by selection of the Scan Control menu editor item 1704. The scan control dialog box preferably has numerous edit-boxes and selection buttons corresponding to the aforementioned parameters settings. Graphical displays of the signal intensity, spectrum and phase of the MRI echo are also preferably provided in subframes for easy user viewing.

Figure 18A:
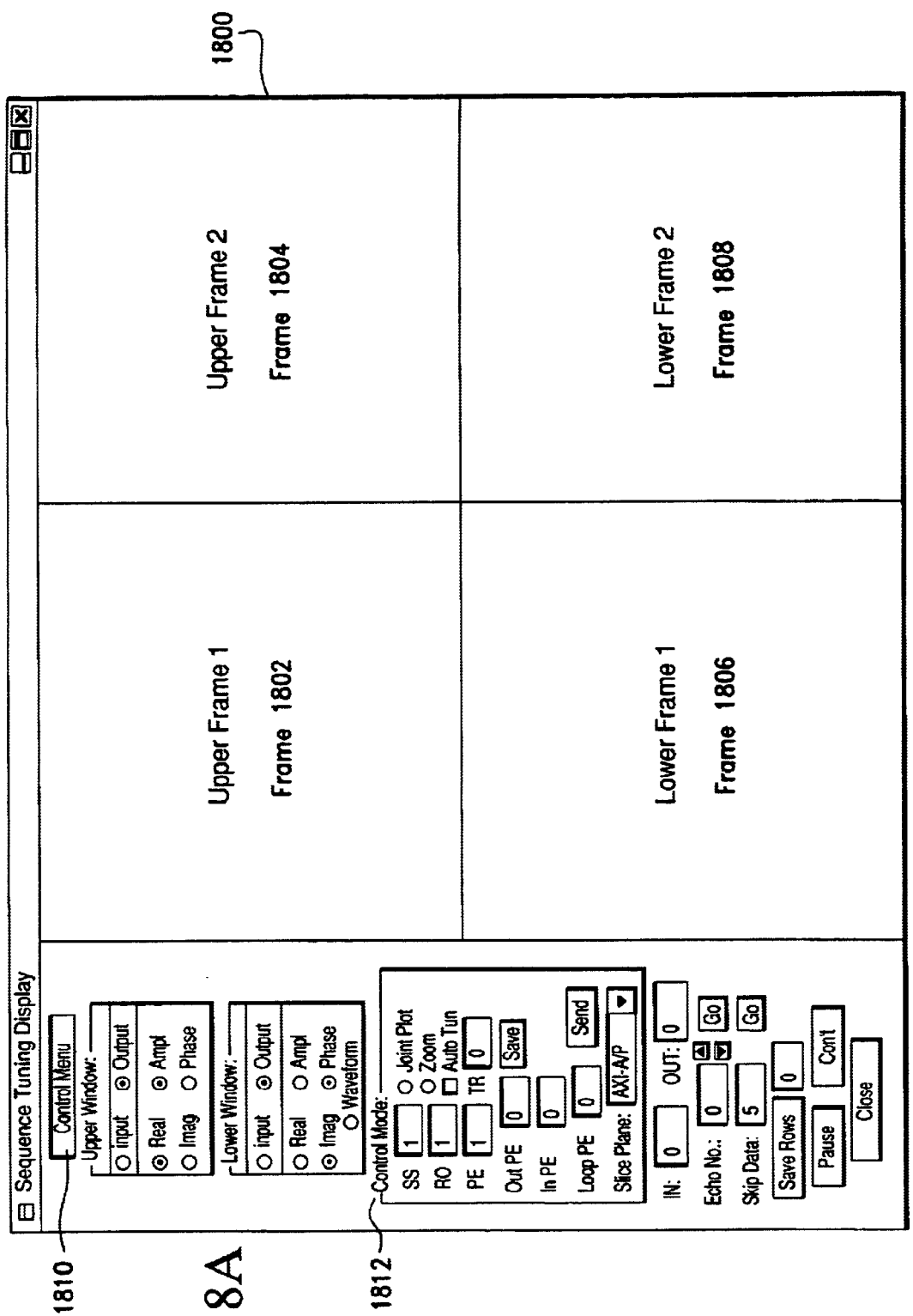
FIGS. 18A and 18B illustrate an exemplary tuning display and illustrative plots displayed therein.

Once these parameters are tuned, calibration of the sequence may be initiated by user selection of the Seq Tuning menu editor item 1706 which preferably generates a sequence tuning dialog box 1800, including four control frames 1802, 1804, 1806, and 1808, for graphical display, as illustrated in FIG. 18A. Numerous controls are provided and are generally divided into a control menu section 1810 and control mode section 1812. Various radio buttons under the control menu section 1810 provide selection options for specific signals, e.g., input/output from the scanner, real and imaginary parts, and amplitude and phase of the MRI echo to be displayed in the upper and lower frames. The control mode section 1812 provides control to the user of, for example, sequence repetition times, toggling of each of the gradients, selection of the warp level of the PE gradient, etc.

Figure 18B:
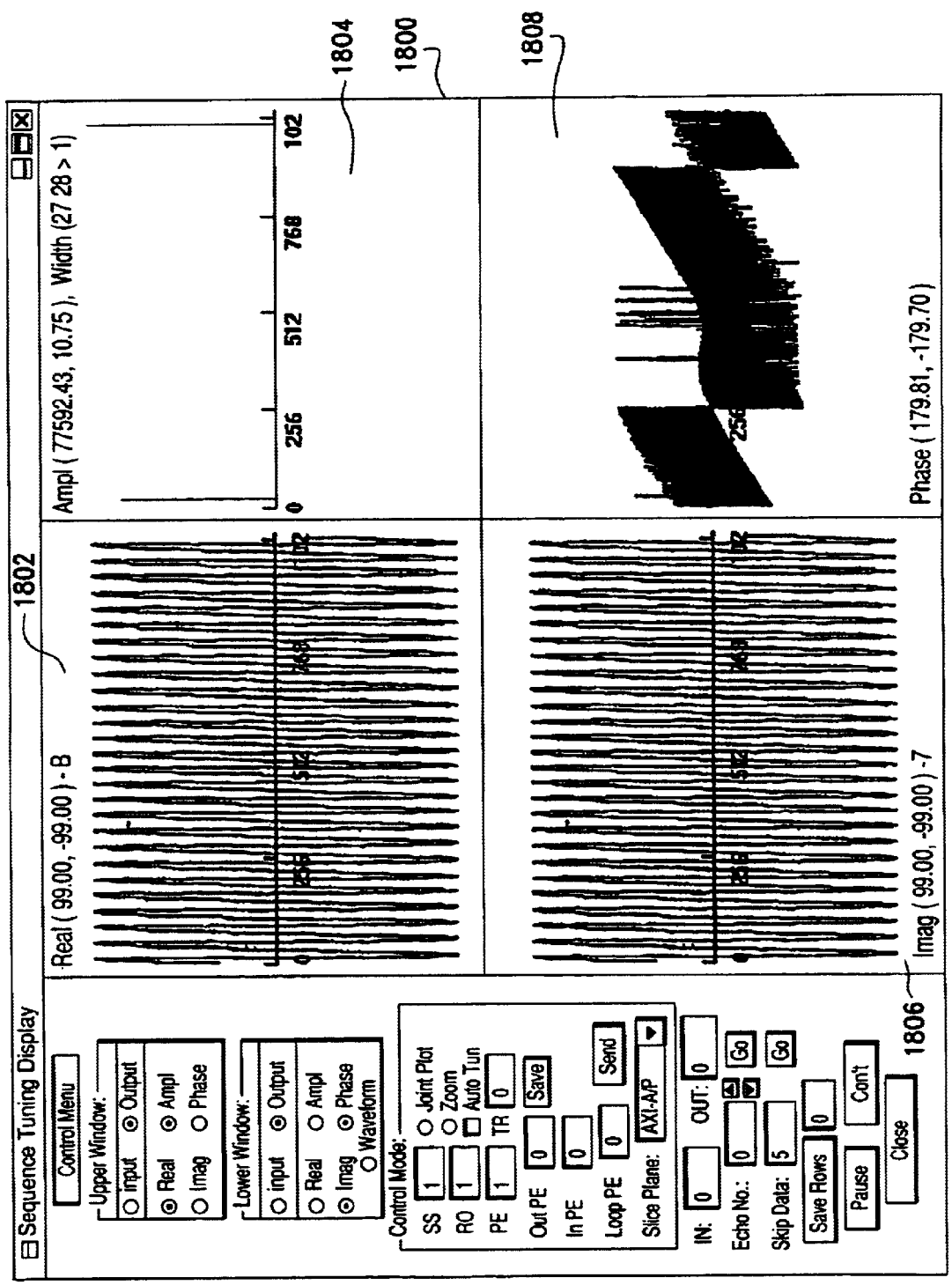

In FIG. 18B is illustrated an exemplary artificial harmonic signal as may be displayed in frames 1802, 1804, 1806 and 1808 of the sequence tuning dialog box 1800, and the control menu section 1810. The real and imaginary part of the artificial harmonic are respectively plotted in frames 1802 and 1806 while the amplitude and phase of the echo are respectively displayed in frames 1804 and 1808. In addition to the MRI echoes, gradient waveforms and RF shapes could also be displayed in the sequence tuning dialog box 1800 frames.

Figure 19:
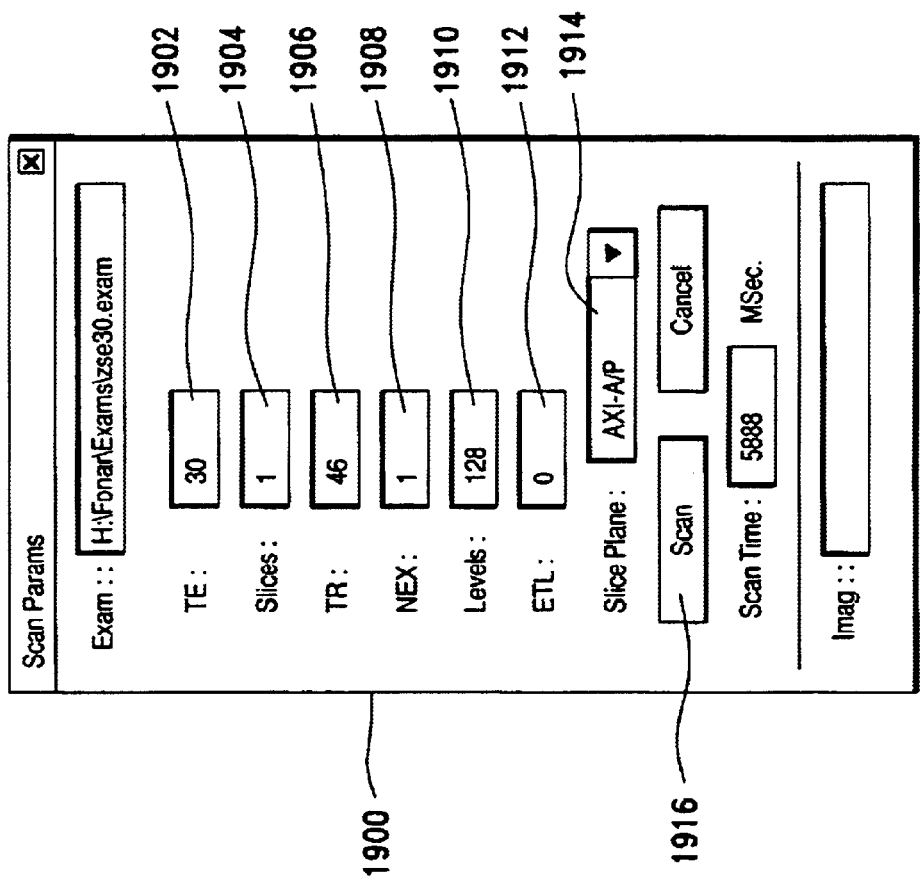
FIG. 19 illustrates an exemplary scan parameters dialog box according to a preferred embodiment of the present invention.

A scan parameters dialog box 1900, as illustrated in FIG. 19, is generated by user selection of the scan menu editor item 1710, located in FIG. 17, for performing a phantom scan as part of the calibration process. Numerous scan parameters are displayed therein, e.g., TE 1902, number of slices 1904, TR 1906, NEX 1908, levels 1910, ETL 1912, and slice plane 1914. Some values are modifiable by the user while static values are shaded so that the user can view, but not modify, the parameters. Selection of the scan button 1916 will initiate a scan, resulting in image reconstruction and display for user analysis.

Preferably, there will be two modes of communication between the graphical user-interface and the front-end. A manual load is available any time a sequence is selected via the procedure described with reference to the second window 1700 of FIG. 17. The sequence will be repeatedly transmitted to the MRI hardware and executed by the MRI scanner. Returning signals are accordingly displayed on sub-windows, or frames, in the Sequence Tuning dialog box 1800 of FIG. 18. Accordingly, in this mode, the loaded sequence that is repeatedly sent to the MRI hardware remains constant during the scan, i.e. the user is unable to modify the sequence once it is loaded and running, and thus the aforedescribed techniques for sequence modification are unavailable in this mode. However, changes made to the sequence can be loaded through the reload feature in the editor sequence tuning, as shown in FIG. 17, particularly the Sequence Tuning menu editor item 1706.

A second mode of communication between the graphical user-interface and the front-end is referred to as auto load and is initiated as soon as the calibration check box 610 of the sequence tailor dialog box 600 is selected. Thereafter, any change of the sequence through the various sequence modification techniques are provided for the graphical user-interface and automatically reloaded and transmitted to the hardware. These resulting signals are immediately retrieved thereby providing the user with a real-time display of the various effects of the user modifications.

Since the desired sequence often becomes distorted inside the aperture 155, the auto-load mode is particularly suitable for dynamic correction of the gradient waveforms. For instance, the phase information of an MRI echo may be calculated and provided to the graphical user-interface through the front-end. This information may be used to reset the reference frequency and phase of the sequence. Such an automated iterative procedure may be used for phase adjustment and alignment of the MRI echoes as well.

Furthermore, initiation of the auto-load mode had by selection of the calibration check box 506 of the sequence tailor dialog box 600 preferably terminates the aforedescribed automatic integral conditioning thereby providing more freedom for sequence manipulation. Concurrently, all related restrictions for modification are terminated.

Although preferred embodiments of the method and apparatus of the present invention have been illustrated in the accompanying Drawings and described in the foregoing Detailed Description, it will be understood that the invention is not limited to the embodiment disclosed, but is capable of numerous rearrangements, modifications and substitutions without departing from the spirit and scope of the invention as set forth and defined by the following claims.

What is claimed is:

1. A magnetic resonance imaging system comprising:
    a display, said display including at least one window with a graphical representation of a magnetic resonance pulse sequence therein; and
    a user interface allowing user interaction between a user and the display,
    said user interaction including dynamic, non-standard and on-the-fly manipulation of, and modification to, said graphical representation of a selected pulse sequence, that is currently undergoing user interaction with real time visual feedback of the interaction on the resultant modified pulse sequence provided to the user.

2. A magnetic resonance imaging system comprising:
    display means for displaying within at least one window a graphical representation of a magnetic resonance pulse sequence;
    input means for receiving input from a user; and
    user interface means coupling said input means and said display means, allowing user interaction with said graphical representation of said pulse sequence,
    said user interaction including dynamic, non-standard and on-the-fly manipulation of, and modification to, said graphical representation of the pulse sequence, that is currently undergoing user interaction with real time visual feedback of the interaction on the resultant modified pulse sequence provided to the user.

3. The magnetic resonance imaging system in accordance with claim 2, further comprising:
    deficiency recognition means for identifying at least one deficiency of the modified pulse sequence.

4. The magnetic resonance imaging system in accordance with claim 3, further comprising:
    correction men for dynamically connecting said at least one deficiency of the modified pulse sequence.

5. A magnetic resonance imaging system that creates and customizes magnetic resonance pulse sequences, comprising;

a user interface, said user interface creating, on a display, a window that illustrates a plurality of menu editor items for user selection, said menu items including:
  a sequence editor item with which said user creates a magnetic resonance pulse sequence from at least one of user entered values and default values or both, and
  a sequence tailor editor item that enables user interaction with a graphical representation of a selected pulse sequence, wherein, during said user interaction, the selected pulse sequence is graphically displayed to the user;
an input unit coupled to said user interface, said input unit allowing entry of at least one user value and a user selection or both;
a scan controller coupled to a computer and a magnetic resonance imaging unit, said scan controller providing real time data delivery between said computer and said magnetic resonance imaging unit, wherein said computer displays said user interface and transmits data to said scan controller; and
wherein said user interaction includes dynamic, non-standard and on-the-fly manipulation of, and modification to, said graphical representation of said selected pulse sequence, that is currently undergoing user interaction with real time visual feedback of the interaction on the manipulated pulse sequence provided to the user.

6. The magnetic resonance imaging system in accordance with claim 5, said system further comprising;
  a storage Unit coupled to said computer, said storage unit storing at least one numerical representation of at least one magnetic resonance pulse sequence.

7. The magnetic resonance system in accordance with claim 5, said system further comprising:
  at least one gradient digital-to-analog converter coupled to said scan controller and at least one gradient coil of said magnetic resonance imaging unit, said at least one gradient digital-to-analog converter receiving digital gradient information from said scan controller and converting said digital gradient information to an analog gradient signal, said analog gradient signal being transmitted to said at least one gradient coil.

8. The magnetic resonance imaging system in accordance with claim 5, said system further comprising;
  at least one radio frequency shaper digital-to-analog converter coupled to said scan controller and at least one transmitter coil, said at least one radio frequency shaper digital-to-analog converter receiving digital radio frequency shape information from said scan controller, converting said digital radio frequency shape information to an analog radio frequency shape signal, and modulating said analog radio frequency shape signal on said at least one transmitter coil.

9. The magnetic resonance system in accordance with claim 8, wherein said scan controller further comprises at least one synthesizer said at least one synthesizer controlling the phase and frequency of modulation of said analog radio frequency shape signal.

10. The magnetic resonance system in accordance with claim 9, said system further comprising:
  at least one receiver coil coupled to said scan controller and receiving an echo signal from application of said analog gradient signal and said analog radio frequency shape signal to a specimen aperture of said magnetic resonance imaging unit, said at least one synthesizer applying frequency and phase to a receiver channel and acquiring said echo signal, said frequency and phase settings included in at least one numerical representation transmitted to said at least one synthesizer from said computer.

11. A magnetic resonance imaging system that creates and customizes magnetic resonance pulse sequences, comprising;
  a user interface that creates, on a display, a window illustrating a plurality of menu editor items for user selection, said menu items including:
    a sequence editor item that creates a magnetic resonance pulse sequence from at least one of user entered values and default values or both, and
    a sequence tailor editor item allowing user interaction with a graphical representation of a selected magnetic resonance pulse sequence, wherein during said user interaction, the selected pulse sequence is graphically displayed to the user;
  a dialog box displayed on said display, said dialog box allowing input of at least one of a user value and a user selection or both;
  a scan controller coupled to a computer and a magnetic resonance imaging unit, said scan controller providing real time data delivery between said computer and said magnetic resonance imaging unit, wherein said computer displays said user interface and transmits data to said scan controller; and
  wherein said user interaction includes dynamic, non-standard and on-the-fly manipulation of, and modification to, said graphical representation of said selected pulse sequence, that is currently undergoing user interaction with real time visual feedback of the interaction on the manipulated pulse sequence provided to the user.

12. The magnetic resonance imaging system in accordance with claim 11, said system further comprising;
  a storage unit coupled to said computer, said storage unit storing at least one numerical representation of at least one magnetic resonance pulse sequence.

13. The user interface in accordance with claim 11, said system further comprising:
  at least one gradient digital-to-analog converter coupled to said scan controller and at least one gradient coil of said magnetic resonance imaging unit, said at least one gradient digital-to-analog converter receiving digital gent information from said scan controller and converting said digital gradient information to an analog gradient signal, said analog gradient signal being transmitted to said at least one gradient coil.

14. The magnetic resonance imaging system in accordance with claim 11, said system further comprising:
  at last one radio frequency shaper digital-to-analog converter coupled to said scan controller ant at least one transmitter coil, said at least one radio frequency shaper digital-to-analog converter receiving digital radio frequency shape information from said scan controller, converting said digital radio frequency shape information to an analog radio frequency shape signal, and modulating said analog radio frequency shape signal on said at least one transmitter coil.

15. The magnetic resonance imaging system in accordance with claim 14, wherein said scan controller further comprises at least one synthesizer controlling the phase and frequency of modulation of said analog radio frequency shape signal.

16. The magnetic resonance imaging system in accordance with claim 15, said system further comprising:

at least one receiver coil coupled to said scan controller and receiving an echo signal from application of said analog gradient signal and said analog radio frequency shape signal to a specimen aperture of said magnetic resonance imaging unit, said at least one synthesizer applying frequency and phase settings to a receiver channel and acquiring said echo signal, said frequency and phase settings included in at least one numerical representation transmitted to said at least one synthesizer from said computer.

17. A magnetic resonance imaging system comprising:

a display window, said display window including a graphical representation of a magnetic resonance pulse sequence thereon;

an input device that receives input from a user; and a user interface coupling said input device and said display window, allowing user interaction with said graphical representation of said pulse sequence, said user interaction including dynamic, non-standard and on-the-fly manipulation of, and modification to, said graphical representation of the pulse sequence, that is currently undergoing user interaction with real time visual feedback of the interaction on the resultant modified pulse sequence provided to the user.

18. The magnetic resonance imaging system in accordance with claim 17, further comprising:

a deficiency recognition unit, said deficiency recognition unit identifying at least one deficiency of the modified pulse sequence.

19. The magnetic resonance imaging system in accordance with claim 18, further comprising:

a correction unit for dynamically correcting said at least one deficiency of the modified pulse sequence.

20. A magnetic resonance display interface that creates a magnetic resonance sequence on a magnetic resonance imaging machine, and displays multiple windows receiving input from a user, said multiple windows comprising:

a sequence parameters window displaying at least one sequence parameter;

a sequence tailor window displaying at least one control;

a sequence display window having a section displaying at least one of the group consisting of radio frequency characteristics of said sequence a slice select gradient graph, a signal acquisition graph, and a phase encoding graph; and a scan window having at least one scan parameter, wherein user interaction with a magnetic resonance pulse sequence formed by said user from said multiple windows includes dynamic, non-standard and on-the-fly manipulation of, and modification to, a graphical representation of said pulse sequence that is currently undergoing user interaction with real time visual feedback of the interaction on the manipulated pulse sequence provided to the user.

21. The display interface in accordance with claim 20, wherein said at least one sequence parameter accepts a user default value.

22. The display interface in accordance with claim 20, wherein said at least one sequence parameter accept a user entered value.

23. The display interface in accordance with claim 20, wherein said at least one sequence parameter is selected from the group consisting of: a gradient resolution parameter, a radio frequency pulse resolution parameter, an echo gathering time parameter, a sequence name parameter, at least one gradient motion compensation parameter, at least one radio frequency pulse characteristic parameter, and at least one data acquisition parameter.

24. The display interface in accordance with claim 20, wherein said at least one control comprises at least one of a control section, a shape editor, a block editor, and a time scaler.

25. The display interface in accordance with claim 24, wherein said shape editor modifies at least one radio frequency pulse characteristic parameter and the radio frequency pulse shape associated with said sequence.

26. The display in accordance with claim 24, wherein said time scaler displays at least one vertical line through the graphically displayed selected pulse sequence assisting the user in analysis of timing relations of the pulse sequence.

27. The display interface in accordance with claim 20, wherein said at least one scan parameter is selected from the group coring of: a number of slices parameter, a slice thickness parameter, a sequence repetition parameter, a number of phase encoding levels parameter, a discrete Fourier transform size parameter, a polarity flipping parameter, and combinations thereof.

28. The display interface in accordance with claim 27, wherein said at least one scan parameter accepts a default value.

29. The display interface in accordance with claim 27, wherein said at least one scan parameter accept a user entered value.

30. The display interface in accordance with claim 20, wherein said scan setting window initiates at least one type of scan to perform.

31. The display interface in accordance with claim 30, wherein said at least one type of scan comprises at least one scan selected from the group consisting of: a two-dimensional scan, a combination scan, a three-dimensional scan a three-dimensional combination scan, a two-dimensional fist spin echo scan, and combinations thereof.

32. A method that creates a magnetic resonance pulse sequence used on a magnetic resonance imaging machine, said method comprising the steps of:

displaying a graphical user interface receiving: input from a user and showing said magnetic resonance pulse sequence;

receiving at least one sequence parameter from a user;

displaying a sequence tailor window in said graphical user interface;

displaying a sequence display window in the graphical user interface, said sequence display window displaying at least one of the group consisting of: radio frequency characteristics of said pulse sequence a slice select gradient graph, a signal acquisition graph, and a phase encoding graph;

receiving at least one command from the user to manipulate a graphical representation of said pulse sequence; and displaying, in real time, visual feedback of the interaction on the manipulated pulse sequence provided to the user, wherein user interaction includes dynamic, non-standard and on-the-fly manipulation of, and modification to, said graphical representation of the pulse sequence that is currently undergoing user interaction.

33. The method in accordance with claim 32, wherein said at least one sequence parameter accept a default value.

34. The method in accordance with claim 32, wherein said at least one sequence parameter accept a user entered value.

35. The method in accordance with claim 32, wherein said at least one sequence parameter is selected from the group consisting of: a gradient resolution parameter, a radio frequency pulse resolution parameter, an echo gathering time parameter, a sequence name parameter, at least one gradient motion compensation parameter, at least one radio frequency pulse characteristic parameter, and at least one data acquisition parameter.

36. The method in accordance with claim 32, wherein said step of displaying a sequence tailor window further comprises the step of:

displaying at least one of a control section, a shape editor, a block editor, and a time scaler.

37. The method in accordance with claim 36, wherein said step of displaying at least one of a control section, a shape editor, a block editor, and a time scaler further comprises the steps of:

activating said shape editor; and modifying at least one of the radio frequency pulse characteristic parameters and the radio frequency pulse shape associated with said pulse sequence.

38. The method in accordance with claim 36, wherein said step of displaying at least one of a control section, a shape editor, a block editor, and a time scaler further comprises the steps of:

activating said time scaler; and displaying at least one vertical line through the graphically displayed pulse sequence for assisting the user in analysis of timing relations of the pulse sequence.

39. The method according to claim 32, further comprising the step of:

receiving at least one scan parameter from the user.

40. The method in accordance with claim 39, wherein said at least one scan parameter is selected from the group consisting of: a number of slices parameter, a slice thickness parameter, a sequence repetition parameter, a number of phase encoding levels parameter, a discrete Fourier transform size parameter, a polarity flipping parameter, and combinations thereof.

41. The method in accordance with claim 40, wherein said at least one scan parameter accepts a default value.

42. The method in accordance with claim 40, wherein said at least one scan parameter accepts a user entered value.

43. The method in accordance with claim 42, wherein said step of initiating a magnetic resonance imaging scan initiates at least one type of scan.

44. The method in accordance with claim 43, wherein said at least one type of scan comprises at least one scan selected from the group consisting of: a two dimensional scan, a combination scan, a three dimensional scan, a three dimensional combination scan, a two dimensional fast spin echo scan, and combinations thereof.

* * * * *